United States Patent
Hashimoto et al.

(10) Patent No.: US 8,106,478 B2
(45) Date of Patent: Jan. 31, 2012

(54) SEMICONDUCTOR DEVICE AND STORAGE MEDIUM

(75) Inventors: Chiemi Hashimoto, Tokyo (JP); Toshio Yamada, Tokyo (JP)

(73) Assignee: Renesas Electronics Corporation, Kawasaki-shi (JP)

(*) Notice: Subject to any disclaimer, the term of this patent is extended or adjusted under 35 U.S.C. 154(b) by 515 days.

(21) Appl. No.: 12/014,132

(22) Filed: Jan. 15, 2008

(65) Prior Publication Data

US 2008/0173914 A1    Jul. 24, 2008

(30) Foreign Application Priority Data

Jan. 18, 2007    (JP) ................................. 2007-008690
Dec. 6, 2007    (JP) ................................. 2007-315438

(51) Int. Cl.
*H01L 29/94*    (2006.01)

(52) U.S. Cl. ................ 257/532; 257/296; 257/E27.034

(58) Field of Classification Search .................. 257/296, 257/532, E27.034
See application file for complete search history.

(56) References Cited

U.S. PATENT DOCUMENTS

| | | | | |
|---|---|---|---|---|
| 6,054,751 A * | 4/2000 | Ichikawa et al. | ............... | 257/532 |
| 6,732,335 B2 * | 5/2004 | Takabayashi et al. | ............ | 716/1 |
| 7,615,843 B2 * | 11/2009 | Kang | ............................. | 257/532 |
| 7,667,279 B2 * | 2/2010 | Nakashiba | ..................... | 257/409 |
| 2007/0108554 A1 * | 5/2007 | Hou et al. | ...................... | 257/532 |
| 2008/0122032 A1 * | 5/2008 | Tu et al. | ......................... | 257/532 |
| 2008/0265369 A1 * | 10/2008 | Liaw | ........................... | 257/532 |
| 2010/0219502 A1 * | 9/2010 | Shieh et al. | .................... | 257/532 |
| 2010/0252911 A1 * | 10/2010 | Furuta | ........................... | 257/532 |

FOREIGN PATENT DOCUMENTS

| JP | 8-148578 A | 6/1996 |
|---|---|---|
| JP | 11-168173 A | 6/1999 |
| JP | 2001-085630 A | 3/2001 |

\* cited by examiner

*Primary Examiner* — Allan R Wilson
(74) *Attorney, Agent, or Firm* — Miles & Stockbridge P.C.

(57) ABSTRACT

A power source noise of a semiconductor device having a core cell configuring a logic circuit is reduced. Above the core cell configuring the logic circuit provided on a main surface of a semiconductor substrate are provided a first branch line for a first power source of the core cell, which is electrically connected to a first power source trunk line, and a second branch line for a second power source of the core cell, which is electrically connected to a second power source trunk line. The first and second branch lines are oppositely provided, thereby forming a capacitor between the first and second power sources.

7 Claims, 17 Drawing Sheets

SEMICONDUCTOR DEVICE AND STORAGE MEDIUM

CROSS-REFERENCE TO RELATED APPLICATION

The present application claims priority from Japanese patent application No. JP 2007-008690 filed on Jan. 18, 2007 and No. 2007-315438 filed on Dec. 6, 2007, the contents of which are hereby incorporated by reference into this application.

TECHNICAL FIELD OF THE INVENTION

The present invention relates to semiconductor devices and storage media and, in particular, relates to an effective technique applied to the semiconductor devices each including a core cell configuring a logic circuit and to the storage medium including design information of the semiconductor devices.

BACKGROUND OF THE INVENTION

For example, the number of transistors mounted on a semiconductor device such as a LSI is nowadays highly integrated up to several tens million pieces in conformity with Moore's law. To mount the highly integrated transistors on a semiconductor chip smaller in size, miniaturization of the transistors and that of wirings and the like for connecting these transistors are being developed. On the other hand, as meltdown of the wirings is made easy according to the miniaturization of the wirings, a voltage of a power source is being made lower. Also, as information processings of the semiconductor devices are performed at high speed, the transistors are operated by high speed switching.

When the transistors are operated by the high speed switching, such a problem becomes pronounced that unstableness of operations of circuits, malfunction of the circuits, and the like occur due to a power source noise which is caused when a high current instantaneously flows in a power source system and when a power source voltage is fluctuated. Hence, for example, a so-called bypass capacitor is provided outside an LSI. By charging/discharging electric charges charged in the bypass capacitor instantaneously when the power source noise occurs, voltage fluctuation of the power source is compensated so as to deal with the power source noise.

Incidentally, the present inventors have made a conventional technique search based on a result of the invention from the viewpoint of the fact that: a first branch line (wiring) and a second branch line (wiring) electrically connected respectively to power sources Vdd and Vss supplied to a core cell are oppositely provided to form a capacitor; and this capacitor reduces the power source noise. As a result, from the viewpoint of the power source noise being reduced, Japanese Patent Application Laid-open Publication No. 2001-85630 (Patent Document 1) has been extracted. This Patent Document 1 discloses that the power source noise is reduced by vertical capacitors formed between through-holes extending in a longitudinal direction vertical to a substrate, but no mention is made of formation of capacitors only by the wiring that extends in a horizontal direction parallel with the substrate.

SUMMARY OF THE INVENTION

The present inventors have reviewed the reduction of the power source noise of such a semiconductor device (for example, LSI) that the core cell configuring the logic circuit is connected to the common power source.

When the logical circuit is configured by using a CMIS (Complementary Metal Insulator Semiconductor) logic gate as a core cell, if a signal is inputted to the first-stage logic gate according to control of a clock signal, an output of the first-stage logic gate is inputted to the second-stage logic gate according to a switching operation of the first-stage logic gate. Then, an output of the second-stage logic gate is further inputted to the third-stage logic gate. That is, such a series of operations is repeated. When a microprocessor of 16 bits is used, 16 pairs of logic gates are arranged in parallel to one another, each pair performs a series of operations simultaneously according to the control of the clock signal.

In this semiconductor device, the power source noise has been caused by the fluctuation of the power source current due to the change of the input signal. This power source noise becomes larger as a density of logic gates increases per unit area by the miniaturization of a process technique. When the power source noise is generated, a value of a power source of another logic gate, which is connected to the power source common to and isolated in path from the logic gate, is also changed simultaneously, whereby the malfunction due to the power source noise occurs easily. Further, when the voltage of the power source is made low, since a range of level determination of the logic gate becomes narrow, any errors are easily caused in making the level determination, whereby the malfunction due to the power source noise occurs easily.

It is considered as a countermeasure against such a power source noise that a capacitor (horizontal type capacitor) formed between the wirings extending in the horizontal direction parallel to the substrate and a vertical type capacitor as disclosed in Patent Document 1 are formed separately from the logic gate and connected to the power source. However, this countermeasure requires somewhat another substrate area for forming the above capacitors, which results in preventing high integration. Also, when a vertical type capacitor is formed on the logic gate by the through-hole, a parasite capacitor between the through-hole electrically connected to the power source and a gate made of a conductor is considered to dull speed-up of the switching operations.

An object of the present invention is to provide a technique capable of reducing the power source noise of the semiconductor device including the core cell configuring the logic circuit.

The above and further objects and novel features of the present invention will appear from descriptions of the present specification and the accompanying drawings.

Outlines of representative ones in the inventions disclosed in the present application will be briefly described below.

According to one phase of the present invention, the branch line from the power source trunk line for the power source Vdd and the branch line from the power source trunk line for the power source Vss, both trunk lines being provided in the interlayer insulating film covering the core cell configuring the logic circuit, are disposed oppositely so that the capacitor is formed between the power sources Vdd and Vss.

According to another phase of the present invention, the branch line from the power source trunk line for the power source Vdd, the branch line from the power source trunk line for the power source Vss, or both of the branch lines are oppositely provided with respect to the wiring of the output terminal of the core cell configuring the logic circuit. By doing so, the capacitor is formed for the output terminal and any one of the power source Vdd or Vss or both.

Effects obtained by representative ones of the inventions disclosed in the present application will be briefly described as follows.

According to the present invention, since the capacitor is disposed between the power sources Vdd and Vss of the core cell configuring the logic circuit, there is the effect of reducing the power source noise accompanied by the switching operation of the core cell.

According to another present invention, in which the branch line from the power source trunk line for the power source Vdd, the branch line from the power source trunk line for the power source Vss, or both branch lines is oppositely provided for the wiring of the output terminal of the core cell, since the capacitor can be provided between the output terminal and the power source of the core cell configuring the logic circuit, a delay time can be added to the core cell.

BRIEF DESCRIPTION OF THE DRAWINGS

FIG. 4 is an equivalent circuit of a logic circuit formed by a core cell shown in FIG. 1, the core cell being configured by an inverter, a NAND gate, a NOR gate, and the like.

DESCRIPTION OF THE PREFERRED EMBODIMENTS

Figure 1:
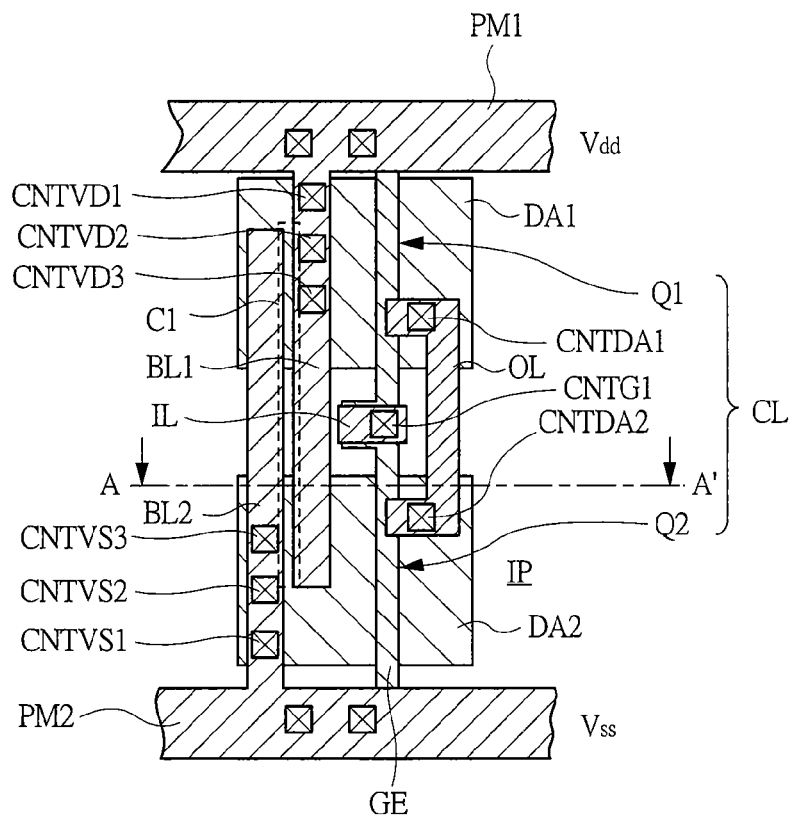
FIG. 1 is a top plan view of a principal part of a semiconductor device according to a first embodiment of the present invention.

Embodiments of the present invention will be described below in detail based on the accompanying drawings. Incidentally, in all the drawings for describing the embodiments, the same members will be denoted to the same reference numerals, and the repeated description thereof will be omitted in principle. Even when the drawings are top plan views, hatches may be provided for understanding easily them as need arises.

First Embodiment

In a semiconductor device according to a first embodiment of the present invention, a logic gate is formed by a CMIS (Complementary MIS) inverter (logic circuit) composed of a p-type MIS (Metal Insulator Semiconductor) transistor and an n-type MIS transistor. In the semiconductor device (for example, LSI) including this CMIS inverter (hereinafter, simply referred to as "inverter"), a process technique for miniaturization is applied, thereby miniaturizing transistors, wirings for connecting these transistors, and the like.

Figure 2:
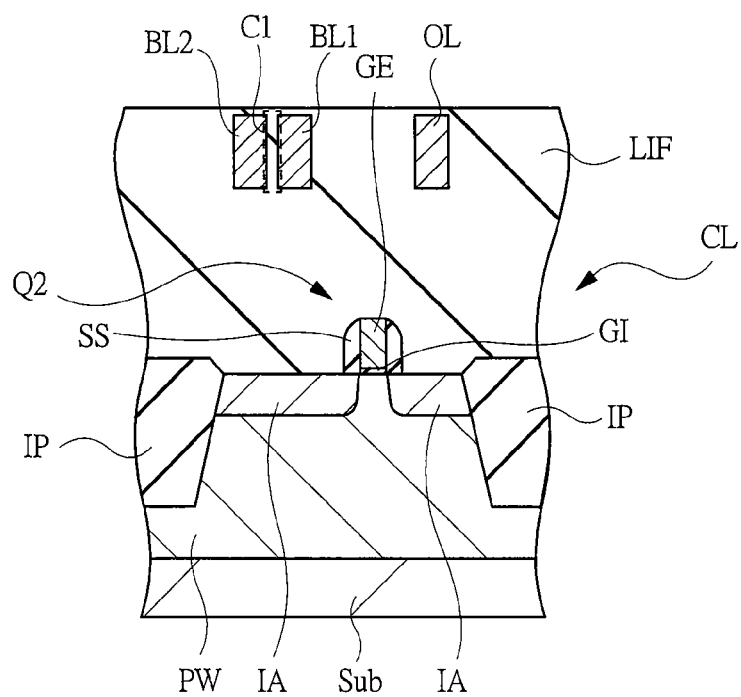
FIG. 2 is a cross-sectional view taken along line A-A' of FIG. 1.

First, the semiconductor device according to the first embodiment will be described with reference to FIGS. 1 and 2. FIG. 1 is a top plan view of a principal part of the semiconductor device according to the first embodiment, and FIG. 2 is a cross-sectional view taken along line A-A' of FIG. 1. Incidentally, the semiconductor device according to the first embodiment may be manufactured by using a known method.

The semiconductor device according to the first embodiment includes a core cell CL configuring an inverter which is formed on a main surface (element forming surface) of a semiconductor substrate Sub composed of, for example, a p-type single crystal silicon substrate. In an element region or an active region DA1 and in an element region or an active region DA2 adjacently provided in a region of the main surface of the semiconductor substrate Sub, a drain, a source, and a channel region of a p-type MIS transistor Q1 and a drain, a source, and a channel region of an n-type MIS transistor Q2 are formed, respectively. In an insulation isolation region IP partitioning these element regions or active regions DA1 and DA2, for example, a STI (Shallow Trench Isolation) and the like are formed. Incidentally, a boundary between the element region or active region DA1 and the element region or active region DA2 is provided with the insulation isolation region IP.

Hereinafter, the element region or active region DA1, and the element region or active region DA2 will be referred to as "element region DA1" and "element region DA2", respectively.

The n-type MIS transistor Q2 configuring the core cell CL is provided with a gate insulating film GI and a gate electrode GE in order on a p-type well PW formed on the main surface of the substrate Sub. A side wall of this gate electrode GE is provided with a sidewall spacer SS made of, for example, a silicon oxide film. On a surface side of the p-type well PW, a so-called n-type semiconductor region (not shown) with a LDD structure is formed in a self-aligned manner by using the gate electrode GE, and n-type semiconductor regions IA serving as a source and a drain are formed in a self-aligned manner by using the sidewall spacer SS. Incidentally, the p-type MIS transistor Q1 configuring the core cell CL is different from the n-type MIS transistor Q2 only in polarity and, therefore, the description thereof will be omitted.

The main surface of the semiconductor substrate Sub is provided with an interlayer insulating film LIF for insulating and isolating the wirings so as to cover the core cell composed of the p-type MIS transistor Q1 and the n-type MIS transistor Q2. This interlayer insulating film LIF is made of a silicon oxide film formed, for example, by a CVD (Chemical Vapor Deposition) method. Incidentally, although a multi-layer wiring is provided above the core cell CL, only a first wiring layer is shown in FIG. 2. In the present application, an insulating film that insulates and isolates wirings is taken as an interlayer insulating film.

This interlayer insulating film LIF is provided with a power source trunk line PM1 serving as a wiring for the power source Vdd of the core cell CL and a power source trunk line PM2 serving as a wiring for the power source Vss thereof. This power source Vss serves as a reference potential (ground potential, GND) for the core cell CL, and the power source Vdd becomes a potential (+potential) different from that of the power source Vss for the core cell CL.

A contact CNTG 1 for connecting a wiring IL serving as an input side of the core cell CL and the gate electrode GE, a CONTDA 1 for connecting a wiring OL serving as an output side thereof and a source region of the p-type MIS transistor Q1, and a contact CNTDA 2 for connecting the wiring OL and a drain region of the n-type MISFET transistor Q2 are provided, respectively.

These power source trunk lines PM1 and PM2, and the wirings IL and OL are patterned on a silicon oxide film forming the interlayer insulating film LIF by, for example, a sputtering method after depositing a conductive film made of, for example, aluminum (Al), copper (Cu), and Al—Cu alloy. The contacts CNTG1, CNTDA1, and CNTDA2 are each made by: forming a through-hole in the interlayer insulating film LIF; filling an interior of a contact hole with an embedded material (conductive film) such as tungsten (W) and Al—Cu; and removing the unnecessary embedded material. Incidentally, before filling the through-hole with the embedded material, the contacts CNTG1, CNTDA1, and CNTDA2 may each form a barrier metal of, for example, W, titan (Ti), molybdenum inside the contact hole.

Further, the interlayer insulating film LIF is provided with a branch line BL1 serving as a wiring electrically connected to the power source trunk line PM1 for the power source Vdd, and a branch line BL2 serving as a wiring electrically connected to the power source trunk line PM2 for the power source Vss in the same layer. Since these branch lines BL1 and BL2 are formed in the same process as the power source trunk lines PM1 and PM2, they are each made from a conductive film such as aluminum (Al), copper (Cu), and an Al—Cu alloy.

The branch line BL1 is electrically connected to the semiconductor region IA serving as a source region of the p-type MIS transistor Q1 in the element region DA1 via contacts CNTVD1, CNTVD2, and CNTVD3. Also, the branch line BL2 is electrically connected to the semiconductor region IA serving as the source region in the element region DA2 via contacts CNTVS1, CNTVS2, and CNTVS3. Similarly to the contacts CNTG1, CNTDA1, and =A2, these contacts CNTVD1 to CNTVD3, and CNTVS1 to CNTVS3 are each formed by: forming a through-hole in the interlayer insulating film LIF so that the surface of the semiconductor region IA is exposed; and filling this through-hole with the embedded material.

For example, intervals between the contacts CNTVD1, CNTVD2, and CNTVD3 adjacent to one another in the branch line BL1 and the contact CNTG1 of the gate electrode GE are each disposed with a space wider than a distance of a portion opposite to, for example, the branch line BL1 and the branch line BL2. For this reason, such layout that a parasite capacitor is formed by making these contacts extremely adjacent is not presupposed in the first embodiment. Hence, large parasite capacities are not formed between the gate electrode GE made of a conductor and the contacts CNTVD1, CNTVD2, and CNTVD3, whereby a high speed switching operation can be performed.

In each of regions surrounded by dotted lines in FIGS. 1 and 2 with the branch lines BL1 and BL2 being opposed to each other, a capacitor C1 is formed. Since the insulating film between the branch lines BL1 and BL2 is made of a silicon oxide film which is the same material as that of the interlayer insulating film LIF, the capacitor C1 is such that a region between the branch lines BL1 and BL2 is filled with the silicon oxide film and serves as an electrode surface. This capacitor C1 is formed between the power sources Vdd and Vss, and serves as a so-called bypass condenser, thereby making it possible to suppress generation of the power source noise at a time of the high speed switching operations of the transistors.

The bypass capacitor is caused to discharge electric charges charged in the bypass capacitor in a moment when the power source noise is generated, thereby compensating for a value of the power source. Therefore, it is desirable to place the bypass capacitor as closely as possible to the transistors. As for reducing the generation of the power source noise as much as possible, it is desirable that capacity of the bypass capacitor is made as large as possible. Specifically, according to the switching operation of the MIS transistor Q1, a drain current of the MIS transistor Q1 changes and causes fluctuation of a power source voltage, so that it is desirable that the bypass capacitor is formed at a drain terminal portion connected to the power source voltage in the element region DA1 by using the wiring from which a power source contact is taken. This is because when a forming position of the bypass capacitor is away in distance from a generating source of the power source noise, a suppressive effect of the fluctuation of the power source voltage is reduced by an influence of series resistance.

In the first embodiment, as shown in FIGS. 1 and 2, since the capacitor C1 is provided above the core cell CL, that is, adjacently to the core cell CL and near the drain of the p-type MIS transistor Q1 that causes the fluctuation of the power source voltage, the generation of the power source noise can be suppressed more suitably. Specifically, the branch line BL1 is provided so as to extend from the element region DA1 to the element region DA2, the branch line BL2 is provided so as to extend from the element region DA2 to the element region DA1, and opposing surfaces of the branch lines BL1 and BL2 opposed to each other serve as electrode surfaces, whereby the capacitor C1 is formed. As a result, the generation of the power source noise can be suppressed more suitably.

Further, in the first embodiment, the branch lines BL1 and BL2 are provided beyond a boundary between the element regions DA2 and DA1, so that an area to be an electrode surface is made larger, that is, the capacity of the capacitor 1 is made larger. As a result, the generation of the power source noise can be further suppressed. Incidentally, to form the electrode surface of the capacitor 1, if the branch lines BL1 and BL2 are opposed to each other, at least one of the branch line BL1 and the branch line BL2 may be provided beyond the boundary between the element regions DA1 and DA2.

The present invention that suppresses the generation of such power source noise is effective particularly when a logic circuit is configured by using a logic gate representing an inverter. The power source noise caused by the change of the power source current due to the change of the input signal of the logic gate, which performs the high speed switching operation, is suppressed by the capacitor 1 shown in the first embodiment to be connected to the power source common to the logic gate performing the switching operation, so that the power source fluctuation is suppressed and the generation of the malfunction due to the power source noise can be suppressed for the power source of another logic gate that is adjacent to and isolated from the logic gate in path.

Also, when the voltage of the power source is made low, since the range of the level determination of the logic gate is narrowed, any errors are easily caused in making the level determination. However, as the generation of the power source noise can be suppressed, the generation of the malfunction due to the power source noise can be suppressed.

The semiconductor device according to the first embodiment is small in dimension in a direction parallel to the main surface of the semiconductor substrate due to the miniaturization of the process technique, and since a spacing between the wirings opposite to each other in the same layer is kept small, the wiring is made thick so as to make a cross-sectional area of the wiring large for the purpose of suppressing the increase of the wiring resistance. In other words, the branch lines BL1 and BL2 composed of the wirings configuring the capacitor C1 are each shorter in the direction parallel to the main surface of the semiconductor substrate Sub in dimension than in the direction vertical to the main surface of the semiconductor substrate Sub. As a result, the cross-sectional area of the wiring is secured, and the increase of the wiring resistance can be suppressed.

If need arises, the dimension in the direction parallel to the main surface of the semiconductor substrate Sub is made larger than the dimension in a direction vertical to the main surface of semiconductor substrate Sub, so that the semiconductor device may have a horizontally long cross-sectional structure. In this case, since the cross-sectional area of the wiring is further increased while the value of the capacitor C1 is ensured to the same degree as a capacitor with a longitudinal cross-sectional area, the wiring resistance can be made lower.

Figure 3:
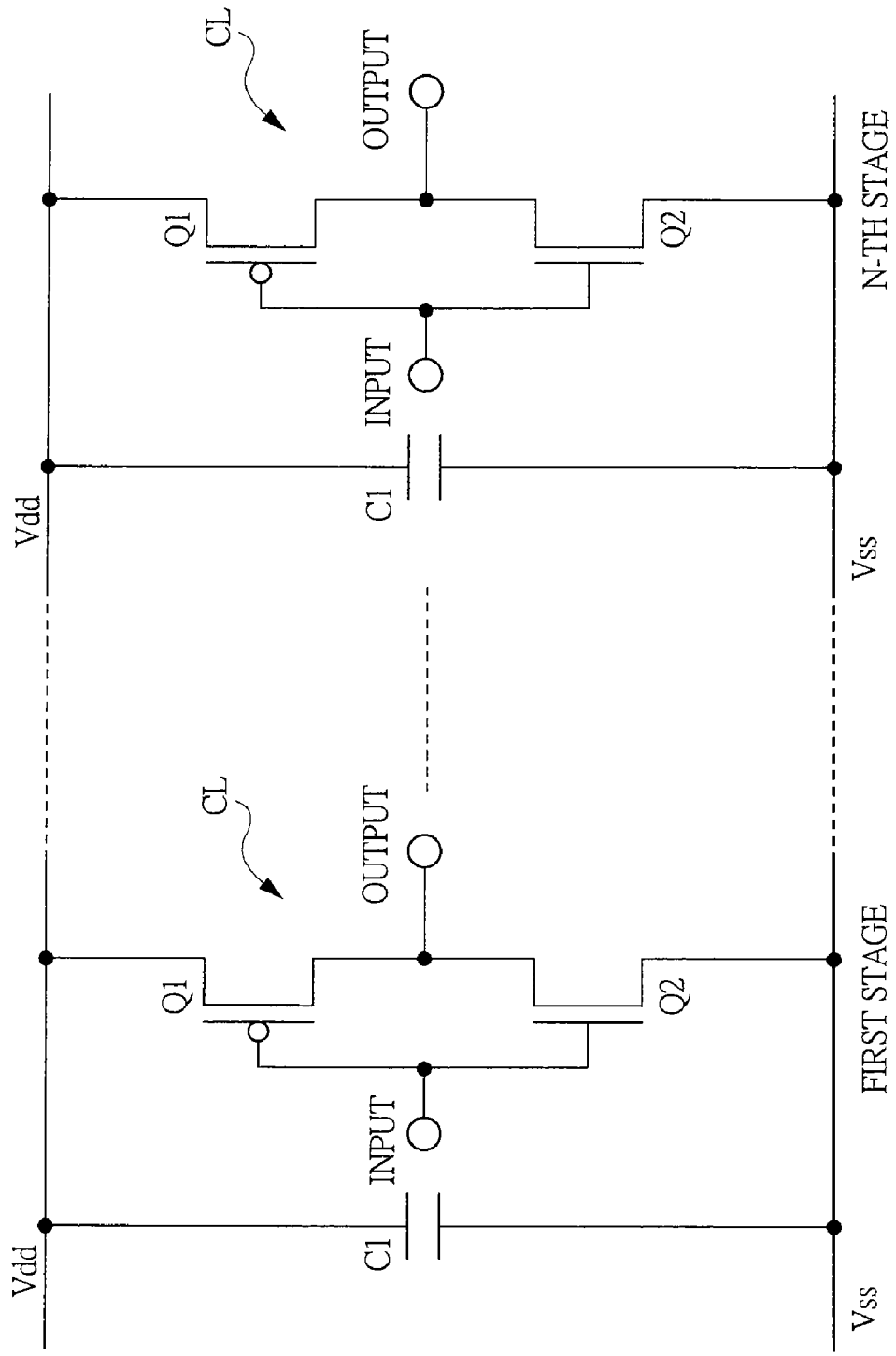
FIG. 3 is an equivalent circuit of the semiconductor device shown in FIG. 1.

Next, one example of an operation of the semiconductor device according to the first embodiment will be described with reference to FIG. 3. FIG. 3 is a view of an equivalent circuit of the semiconductor device shown in FIG. 1. As shown in FIG. 3, the core cell CL is an inverter composed of the p-type MIS transistor Q1 and the n-type MIS transistor Q2, and a plurality of core cells are provided therein. In the core cell CL of each stage, the bypass capacitor C1 formed by the inverter and the branch lines BL1 and BL2 oppositely disposed is connected between the power sources Vdd and Vss.

Based on the control of the clock signal, when the input signal is inputted to the first stage inverter to be changed from a HIGH level to a LOW level, the p-type MIS transistor Q1 becomes in an ON state and the n-type MIS transistor Q2 becomes in an OFF state. Hence, the potential of the power source Vdd is outputted via the p-type MIS transistor Q1 which is in an ON state, so that the output signal is reversed from the LOW level to the HIGH level. This output of the first stage inverter is inputted to the second stage logic circuit.

In the first embodiment, since the capacitor C1 is provided between the power sources Vdd and Vss, electrical charges are accumulated in the capacitor C1. As a result, even when the p-type MISFET transistor Q1 configuring the inverter is in the ON state to carry the current from the power source Vdd to an output, since the capacitor C1 is provided, the electric charges charged in this capacitor C1 are instantaneously discharged, whereby the generation of the power source noise can be reduced.

Also, even when the power source noise is generated at the first stage inverter, since the capacitor C1 is provided in the first embodiment, the power source noise can be removed before reaching the n-th stage inverter isolated in path. Further, even when the voltage of the power source is made low, the malfunction due to the power source noise can be prevented.

Figure 4:
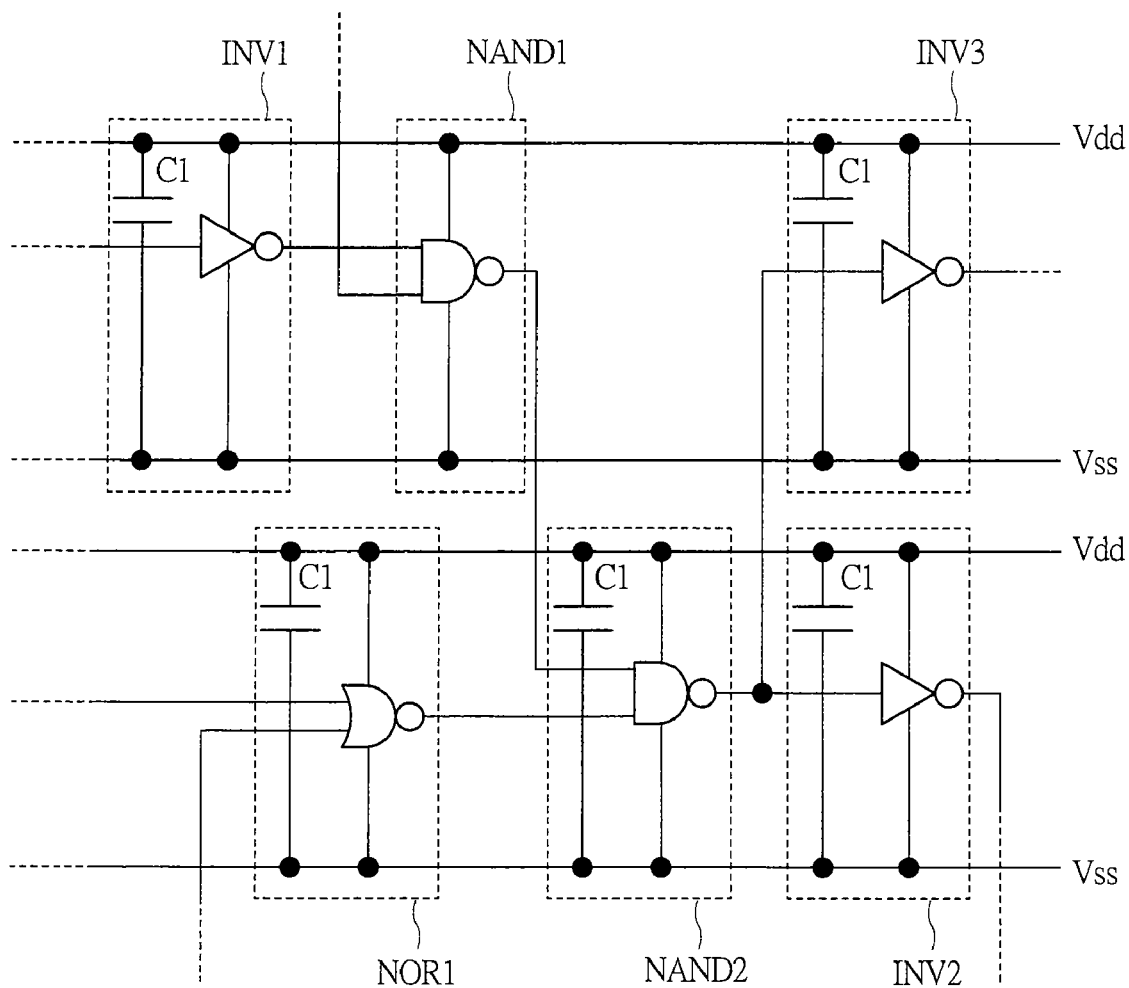

Another example of the operation of the semiconductor device according to the first embodiment will be described with reference to FIG. 4. FIG. 4 is an equivalent circuit of a logic circuit formed by the core cell shown in FIG. 1, the core cell being configured by an inverter, a NAND gate, a NOR gate, and the like. Each of INVs 1, 2, and 3, NANDs 1 and 2, and NOR 1 surrounded by broken lines in FIG. 4 represents the core cell. A gate row sandwiched between the power source trunk lines Vdd and Vss shows one row of core cells, and is suitably disposed and mutually connected based on a connection relationship of the logic circuit.

In FIG. 4, as one example, such connection is made that: an output of the inverter INV1 is inputted to the NAND1; and the NAND2 receives outputs of the NOR1 and NAND1 and is outputted to the INVs 2 and 3. Each core cell is surrounded by the broken line, and each of the INVs 1, 2 and 3, the NAND2, and the NOR1 is provided with the bypass capacitor C1 according to the first embodiment, thereby making it possible to suppress the fluctuation of the power source voltage due to the switching operations of the core cells. The core cell NAND1 is not provided with the bypass capacitor. This represents an example, in which the core cell not based on the first embodiment can be used when there is no need to provide the bypass capacitor or when the bypass capacitor is difficult to provide for convenience of disposing any wiring.

Second Embodiment

In the first embodiment, a description has been made of the case where the insulating film between the first and second branch lines is made of the same material as that of the interlayer insulating film. However, in a second embodiment of the present invention, a description will be made of the case where the insulating film is made of another material. Incidentally, as the other configurations are the same as that of the first embodiment, the description thereof will be omitted.

Figure 5:
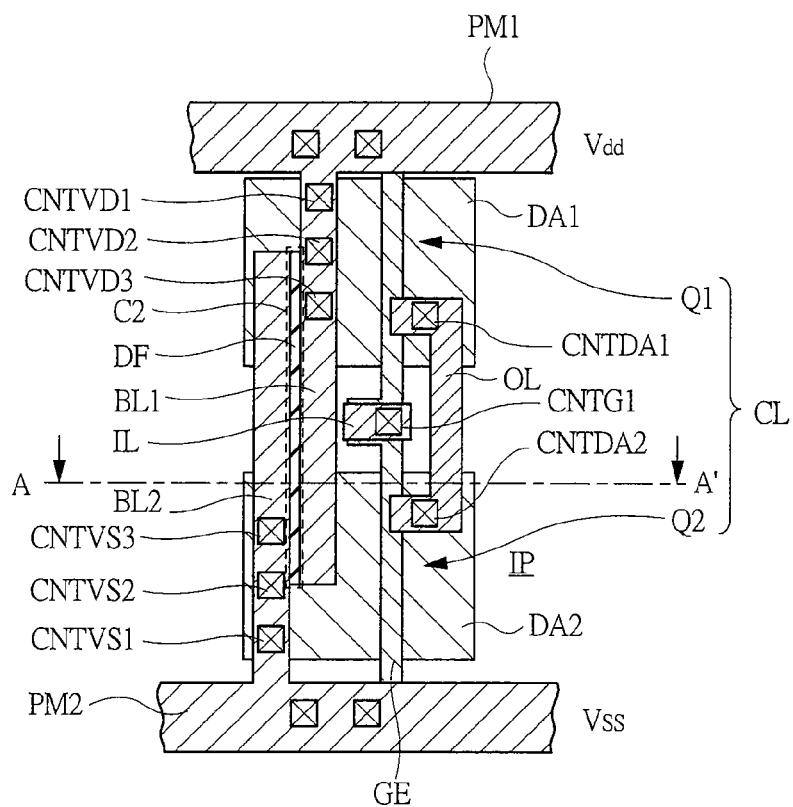
FIG. 5 is a top plan view of a principal part of a semiconductor device according to a second embodiment of the present invention.

In a semiconductor device according to a second embodiment of the present invention, a logic gate is formed by a CMIS inverter (core cell CL) composed of the p-type MIS transistor Q1 and the n-type MIS transistor Q2. FIG. 5 is a top plan view showing a principal part of the semiconductor device according to the second embodiment of the present invention, and FIG. 6 is a cross-sectional view taken along line A-A' of FIG. 5.

Figure 6:
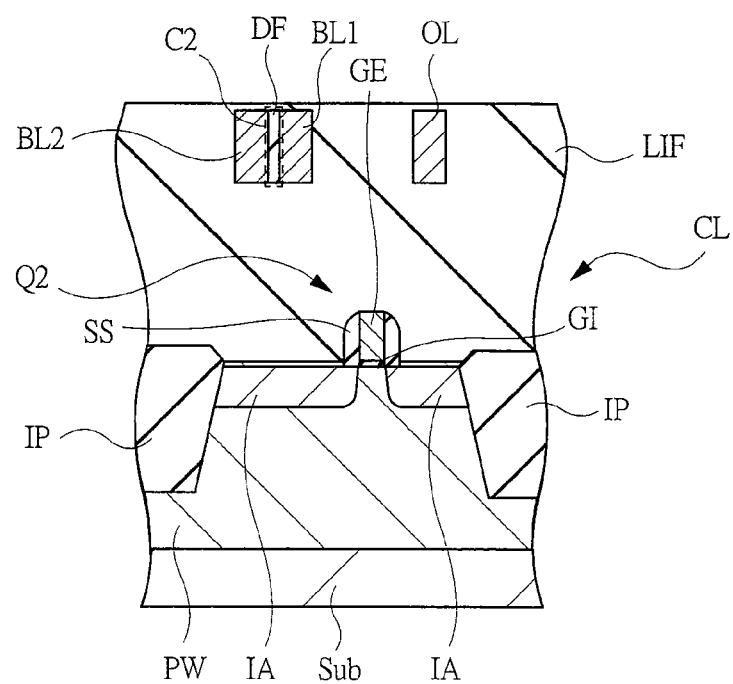
FIG. 6 is a cross-sectional view taken along line A-A' of FIG. 5.

In regions surrounded by dotted lines in FIGS. 5 and 6, a branch line BL1 electrically connected to a power source trunk line PM1 for the power source Vdd and a branch line BL2 electrically connected to a power source trunk line PM2 for the power source Vss are opposed to each other, whereby a capacitor C2 is formed between the power sources Vdd and Vss. Between the branch lines BL1 and BL2, a high dielectric constant film DF higher in dielectric constant than an interlayer insulating film LIF is provided. Specifically, the interlayer insulating film LIF is made of a silicon oxide film with a dielectric constant of approximately 4.2 while the high dielectric constant film DF is made of a silicon nitride film with a dielectric constant of approximately 7 to 9 or aluminum ($Al_2O_3$) with a dielectric constant of approximately 8.5. Also, the interlayer insulating film LIF may be made of SiOC with a dielectric constant of approximately 3.

A manufacturing process of the semiconductor device according to the second embodiment will be roughly described below. Incidentally, the core cell CL configuring the logic circuit provided on the main surface of the semiconductor substrate Sub may be manufactured by using a known manufacturing method.

First, a silicon oxide film to configure the interlayer insulating film LIF on the semiconductor substrate Sub is formed so as to cover the core cell CL, and then the silicon oxide film is flattened by a CMP (Chemical Mechanical Polishing) method. Next, conductive films (for example, copper and the like) to configure the branch lines BL1 and BL2 formed in the same layer are formed on the silicon oxide film, and then the conductive films are patterned by using a photolithography technique and a etching technique. That is, the conductive films are patterned as shown in FIG. 4.

Subsequently, a mask which is opened between the branch lines BL1 and BNL2 opposed to each other is formed in the branch lines BL1 and BL2 and the silicon oxide film. Next, the silicon nitride film to form the high dielectric constant film DF is embedded between the opposing branch lines BL1 and BL2 by, for example, the CVD method. Next, after removing the mask, the silicon oxide film to configure the interlayer insulating film LIF is formed by, for example, the CVD method so as to cover the branch lines BL1 and BL2. As a result, the branch lines BL1 and BL2 are opposed to each other, whereby the capacitor C2 is formed between the power sources Vdd and Vss.

In this manner, the capacitor C2 is provided with the high dielectric constant layer DF higher in dielectric constant than the interlayer insulating film LIF between the branch lines BL1 and BL2. Hence, the capacitor C2 is larger in capacity than the capacitor C1 of the first embodiment, thereby making it possible to suppress the generation of the power source noise more suitably.

Third Embodiment

In the first embodiment, a description has been made of the case where the first branch line and the second branch line are provided on the same layer. However, in a third embodiment of the present invention, a description will be made of the case where these branch lines are provided in different layers. Incidentally, as the other configurations are the same as those of the first embodiment, the description thereof will be omitted.

Figure 7:
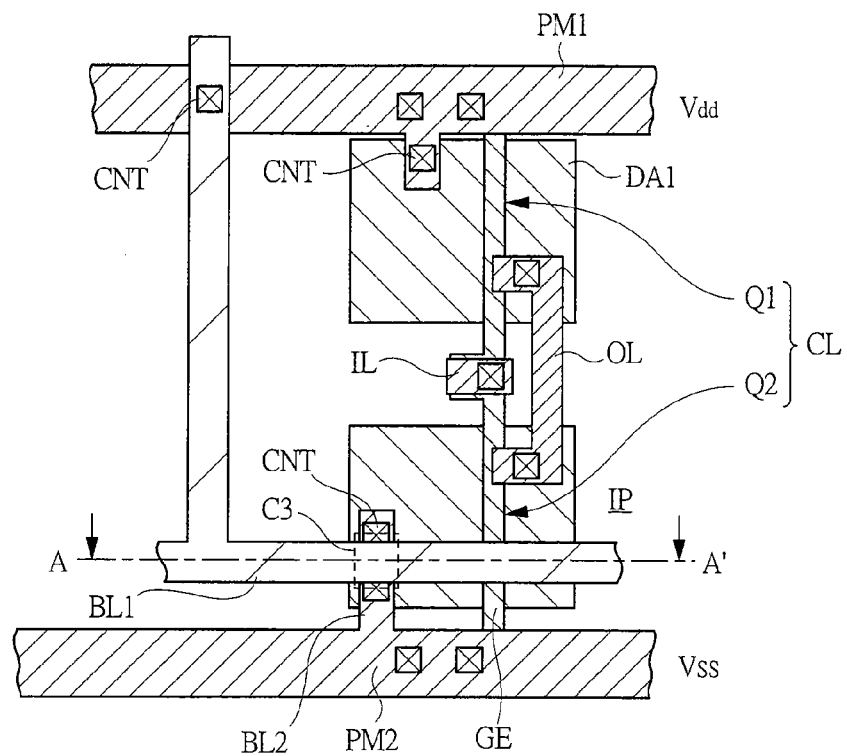
FIG. 7 is a top plan view of a principal part of a semiconductor device according to a third embodiment of the present invention.

In a semiconductor device according to a third embodiment of the present invention, a logic gate is formed by a CMIS inverter (core cell CL) composed of a p-type MIS transistor Q1 and an n-type MIS transistor Q2. FIG. 7 is a top plan view showing a principal part of a semiconductor device according to a third embodiment of the present invention, and FIG. 8 is a cross-sectional view taken along line A-A' of FIG. 7.

Figure 8:
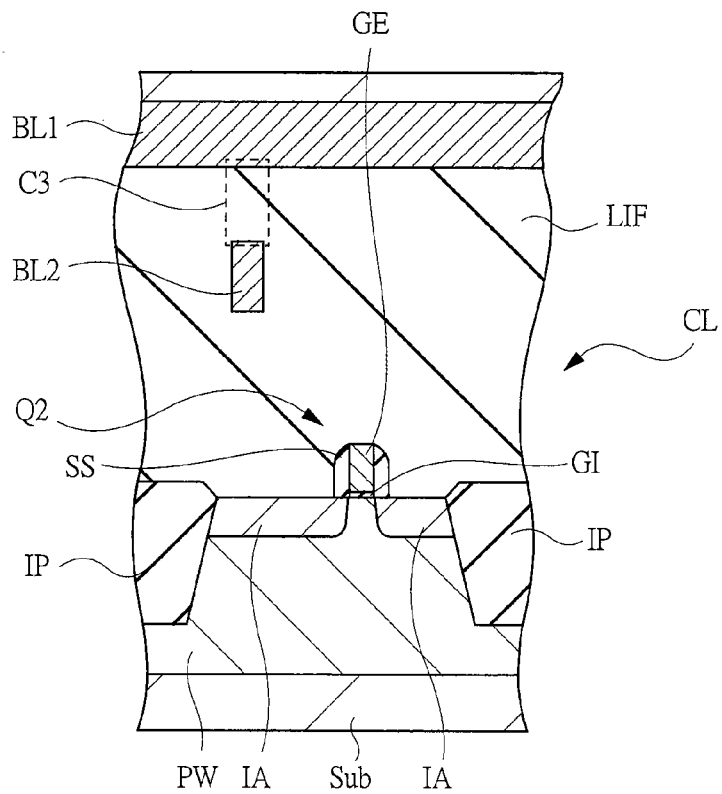
FIG. 8 is a cross-sectional view taken along line A-A' of FIG. 7.

As shown in FIGS. 7 and 8, the main surface of the semiconductor substrate Sub is provided with an interlayer insulating film LIF for insulating and isolating wirings so as to cover the core cell CL composed of a p-type MIS transistor Q1 and an n-type MIS transistor Q2. This interlayer insulating film LIF is made of a silicon oxide film formed by, for example, the CVD method.

This interlayer insulating film LIF is provided with: the power source trunk line PM1 for the power source Vdd of the core cell CL; the power source trunk line PM2 for the power source Vss thereof; the branch line BL1 electrically connected to the power source trunk line PM1; the branch line BL2 electrically connected to the power source trunk line PM2; a wiring IL serving as an input side of the core cell CL; and a wiring OL serving as an output side. From among these lines and wirings, the power source trunk lines PM1 and PM2, the branch line BL2, and the wirings IL and OL are provided in the same layer while the branch line BL1 is provided in a layer different from the layer in which these lines and wirings are provided. Incidentally, the branch line BL1 is electrically connected to the power source trunk line PM1 for the power source Vdd via the contact CNT.

In regions surrounded by dotted lines in FIGS. 7 and 8, the branch line BL1 on an upper layer and the branch line BL2 on a lower layer are opposed to each other, and a capacitor C3 is formed on a overlapped portion thereof. The insulating film between the branch lines BL1 and BL2 is made of a silicon oxide film which is the same material as that of the interlayer insulating film LIF, so that the capacitor 3 is such that a region between the branch lines BL1 and BL2 is filled with the silicon oxide film and serves as an electrode surface. This capacitor C3 can suppress the generation of the power source noise at the time of performing the high speed switching operations of the transistors.

Fourth Embodiment

In the first embodiment, a description has been made of the case where the first branch line and the second branch line extending in the same direction in parallel are opposed to each other to form the electrode surface of the capacitor serving as the bypass capacitor. However, in a fourth embodiment of the present invention, a description will be made of the case where tip portions of the first branch line and the second branch line are opposed to each other to form an electrode surface of a capacitor. Incidentally, as the other configurations are the same as those of the first embodiment, the description thereof will be omitted.

Figure 9:
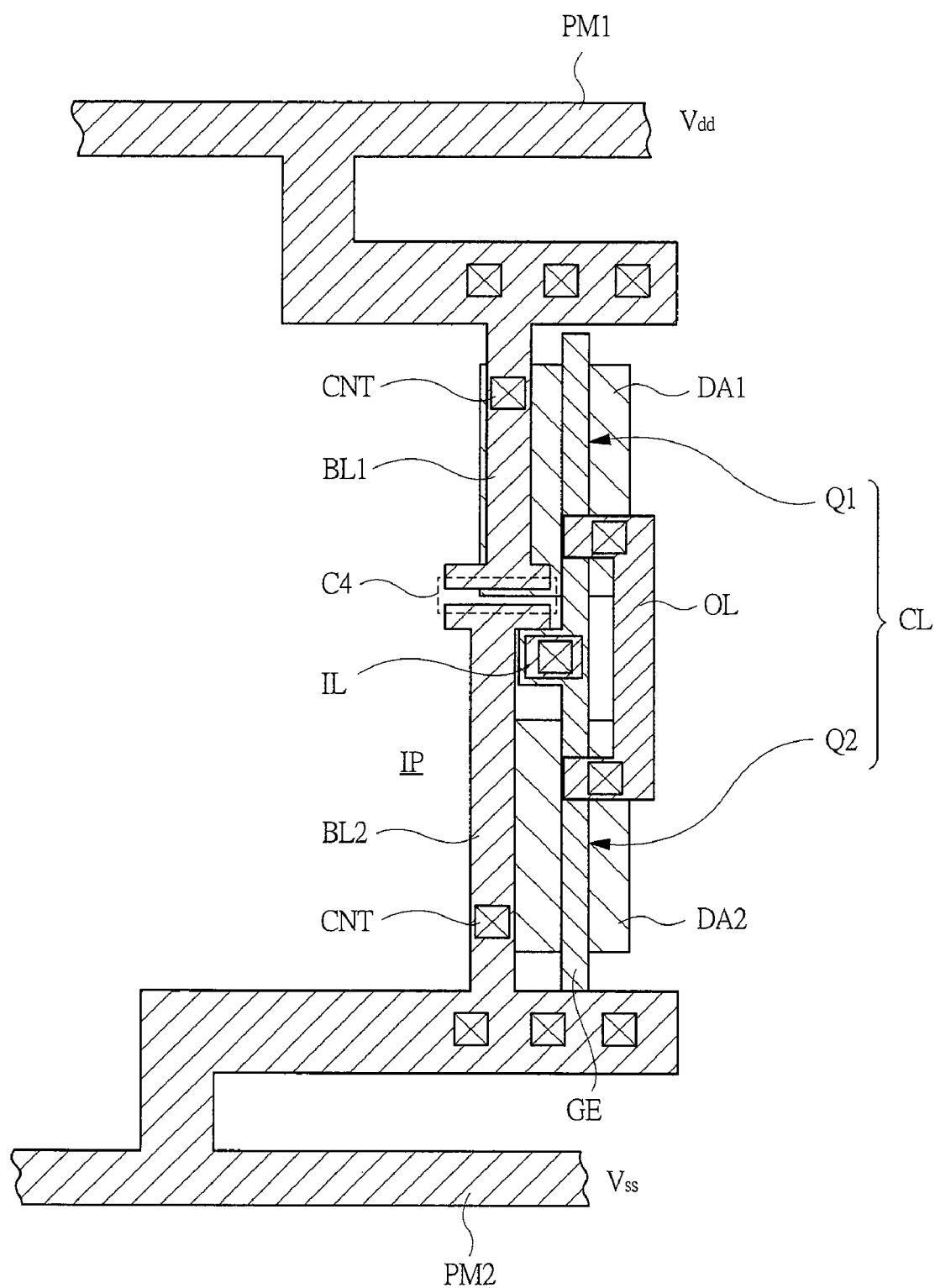
FIG. 9 is a top plan view of a principal part of a semiconductor device according to a fourth embodiment of the present invention.

In a semiconductor device according to a fourth embodiment of the present invention, a logic gate is formed by a CMIS inverter (core cell CL) composed of a p-type MIS transistor Q1 and an n-type MIS transistor Q2. FIG. 9 is a top plan view showing a principal part of a semiconductor device according to a fourth embodiment of the present invention.

As shown in FIG. 9, a branch line BL1 electrically connected to a power source trunk line PM1 for the power source Vdd is provided so as to extend from an element region DA1 to an element region DA2. On the other hand, a branch line BL2 electrically connected to a power source trunk line PM2 for the power source Vss is provided so as to extend from the element region DA2 to the element region DA1. That is, the branch lines BL1 and BL2 extend in the same direction (hereinafter, referred to as "direction A"). The tip portions of the branch lines BL1 and BL2 are branched into a direction (hereinafter, referred to as "direction B") vertical to the direction A, and their plane shapes become T-shaped, and the tip portions are opposed to each other, whereby a capacitor C4 is provided. As a result, the generation of the power source noise can be suppressed more suitably.

Fifth Embodiment

In the first embodiment, a description has been made of the core cell configuring the logic circuit in describing the present invention. However, in a fifth embodiment, a description will be made of the case where the core cell is applied to a flip-flop. Note that the same description as those in the first embodiment will be omitted.

Figure 10:
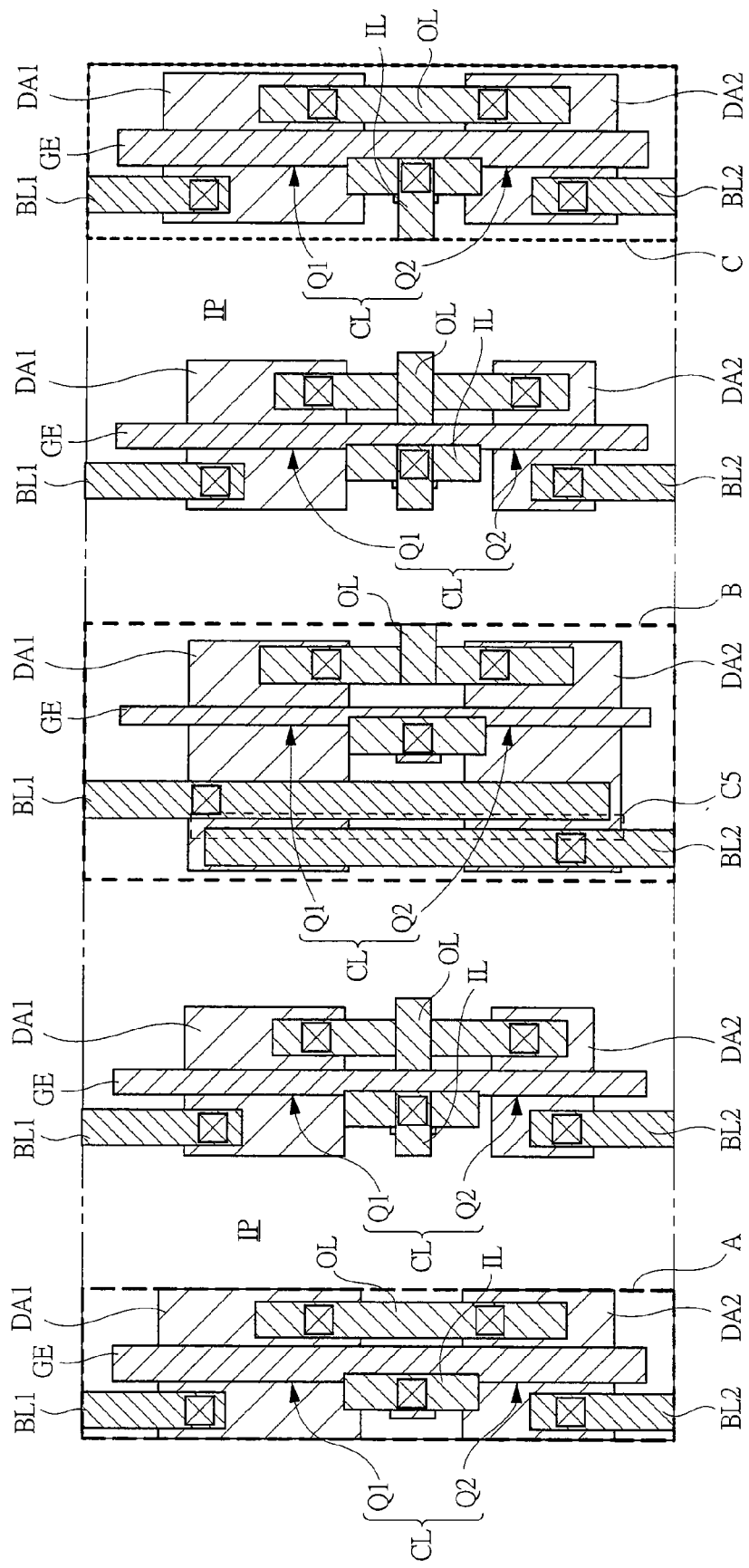
FIG. 10 is a top plan view of a principal part of a semiconductor device according to a fifth embodiment of the present invention.
Figure 11:
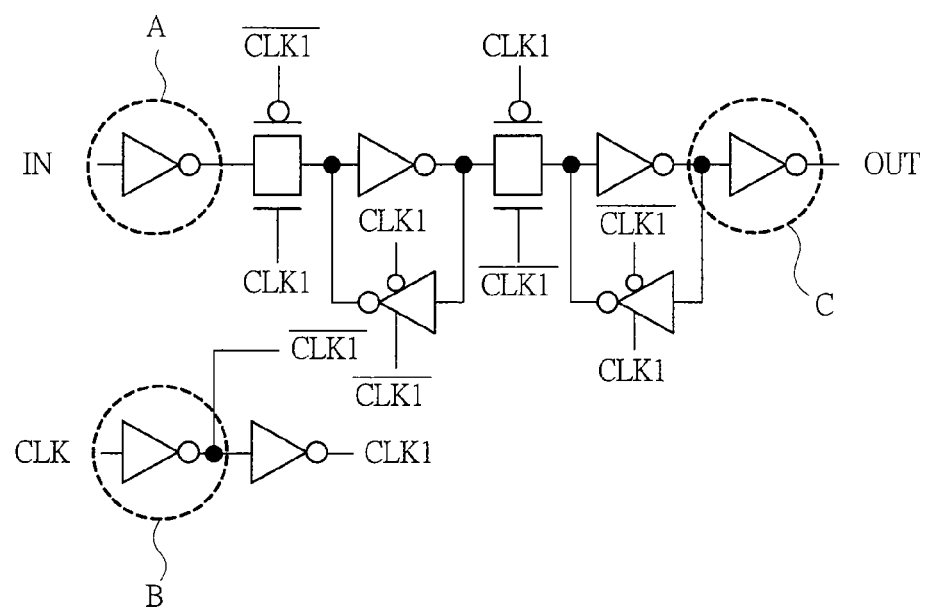
FIG. 11 is an equivalent circuit of the semiconductor device shown in FIG. 10.

A semiconductor device according to a fifth embodiment of the present invention comprises a flip-flop provided with a CMIS inverter (core cell CL) composed of a p-type MIS transistor Q1 and an n-type MIS transistor Q2. FIG. 10 is a plan view showing a principle part of a semiconductor device according to a fifth embodiment of the present invention, and FIG. 11 is an equivalent circuit diagram of the semiconductor device in FIG. 10.

The flip-flop is a master-salve type flip-flop circuit which, according to control of a clock signal (CLK), takes an input (IN) signal therein when the clock signal (CLK) is in a HIGH state, changes an output when the clock signal is in a LOW state, and becomes in a state of retaining data. As shown in FIG. 11, the flip-flop comprises: an inverter (siege A in FIG. 11) on an input (IN) side; an inverter (siege B) on a clock signal (CLK) side; an inverter (siege C) on an output (OUT) side; and the like. The inverters of the sieges A to C in FIG. 11 correspond to the inverters (core cells CL) of sieges A to C in FIG. 10, respectively.

As shown in FIG. 10, the element regions DA1 and DA2 in the siege B are larger in area than the element regions DA1 and DA2 in the other sieges. Hence, in the fifth embodiment, above the element regions DA1 and DA2 (that is, core cells CL) in the siege B larger in area, the branch lines BL1 and BL2 are provided so as to be opposed to each other, thereby forming a capacitor C5. Since the capacitor C5 is provided near the core cell CL in the siege B, the generation of the power source noise can be suppressed more suitably.

In the core cells CL of, for example, the sieges A and C where regions for forming the capacitors cannot be secured above the element regions, it is considered that the capacitors are provided not above the element regions DA1 and DA2 but above the insulation isolation region IP, thereby being formed relatively adjacently to these core cells CL. However, securing areas of the insulation isolation region IP in order to form the capacitors cause an enlargement of the chip size, that is, cause width of the core cells in an array direction of the core cells to be enlarged. Therefore, the fifth embodiment does not secure the capacitors by positively enlarging the chip size in the element regions DA1 and DA2 not capable of forming the capacitors above their own regions.

Incidentally, when a region for forming the capacitor can be secured above the element region, if a bypass capacitor is provided without increasing each area of the sieges A, C, and the like, a bypass capacitor can be formed inside a circuit such as the flip-flop of FIGS. 10 and 11 which operates in synchronization with the same clock. As a result, the bypass capacitor can be disposed at a position close to the generating source of the power source noise, whereby the generation of the power source noise can be suppressed more suitably.

Sixth Embodiment

In the first embodiment, a description has been made of the case where the capacitor serving as a bypass capacitor has been provided on one core cell. However, in a sixth embodiment, a description will be made of the case where a capacitor is formed in a fill-cell for filling a gap between the core cells, which is generated in a cell row integrated with a plurality of core cells when a space of a signal wiring and an array pitch of the core cells are aligned with another cell row. The fill-cell is used to electrically connect a p-type well and an n-type well of the right and left core cells by being disposed in a gap between the core cells. In the fill-cell, although no drain, source, and gate region are always formed similarly to the core cell, the drain, source, and gate region may be provided for the purpose of uniformity of a layout pattern density and the like. Further, when there is no need to electrically connect the p-type well and the n-type well of the right and left core cells, the p-type well and the n-type well may be not provided. Incidentally, since a configuration of the core cell is the same as that of the first embodiment, the description thereof will be omitted.

Figure 12:
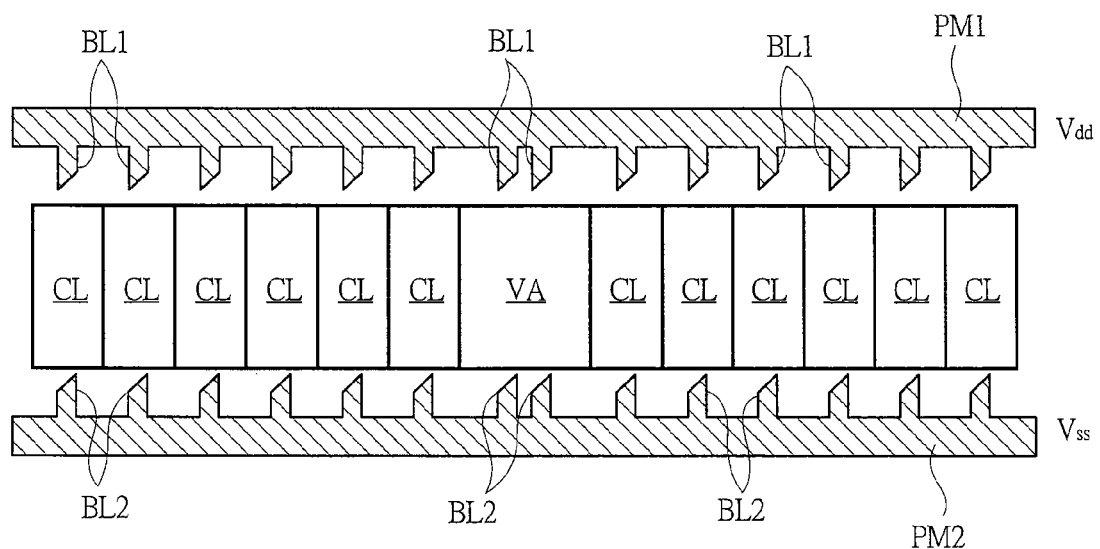
FIG. 12 is a top plan view of a principal part of a semiconductor device according to a sixth embodiment of the present invention.
Figure 13:
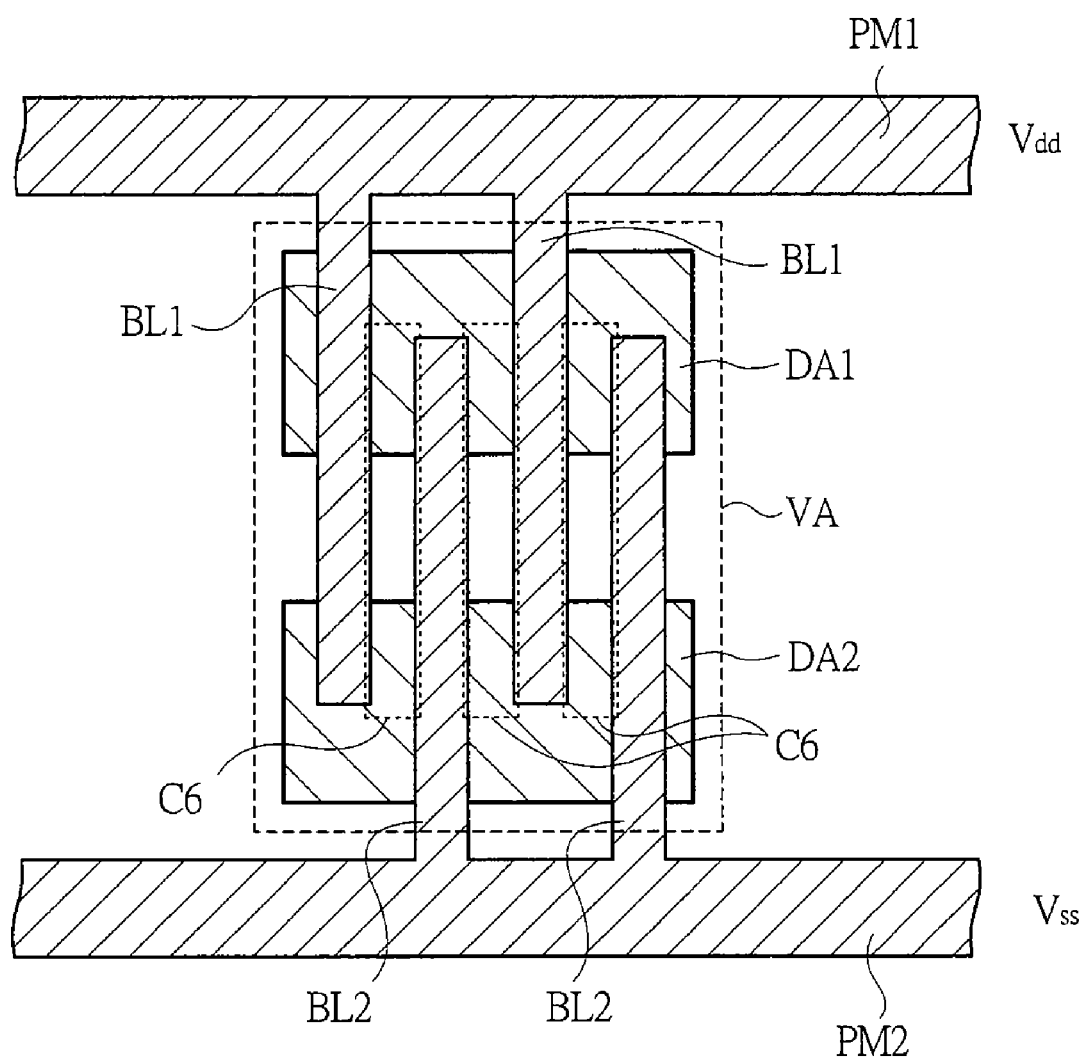
FIG. 13 is an enlarged view of a principal part of FIG. 12.

In a semiconductor device according to a sixth embodiment, a logic circuit is formed by using the fill-cell to fill a gap between the core cells CL, which is generated in the cell row integrated with a plurality of CMIS inverters (core cells CL) composed of a p-type MIS transistor and an n-type MIS transistor. FIG. 12 is a top plan view of a principal part of a semiconductor device according to the sixth embodiment, and FIG. 13 is an enlarged view of a principal part of FIG. 12.

As shown in FIG. 12, the semiconductor substrate includes a region to be provided with the core cell CL and a vacant region VA to be provided with the fill-cell adjacent to the region. As described above, in the region to be provided with the core cell CL, the p-type MIS transistor and the n-type MIS transistor are formed. Also, a power source trunk line PM1 for the power source Vdd and a power source trunk line PM2 for the power source Vss in the core cell CL are provided on the semiconductor substrate.

As shown in FIG. 12, the core cell CL composed of the p-type MIS transistor and the n-type MIS transistor is covered with an interlayer insulating film LIF on its upper portion. That is, the region to be provided with the core cell CL is provided with the interlayer insulating film LIF on the main surface of the semiconductor substrate Sub. Likewise, the region to be provided with the fill-cell is provided with the interlayer insulating film LIF on the main surface of the semiconductor substrate Sub.

This interlayer insulating film LIF is provided with a branch line BL1 serving as a wiring electrically connected to the power source trunk line PM1 for the power source Vdd and a branch line BL2 serving as a wiring electrically connected to the power source trunk line PM2 for the power source Vss in the same layer. In FIG. 12, as shown in the first embodiment, the branch lines BL1 and BL2 are each oppositely provided in the region to be provided with the core cell CL, so that a capacitor is formed between the power supplies Vdd and Vss and, in addition thereto, the vacant region VA to be provided with the fill-cell is also oppositely provided with each of the branch lines BL1 and BL2.

As shown in FIG. 13, in a region surrounded by dotted lines, the branch line BL1 electrically connected to the power source trunk line PM1 for the power source Vdd and the branch line BL2 electrically connected to the power source trunk line PM2 for the power source Vss are opposed to each other, whereby a capacitor C6 is formed between the power sources Vdd and Vss. This capacitor C6 is formed above the vacant region VA to be provided with no core cell. Thus, since a capacitor serving as the bypass capacitor is formed in the vacant region VA, a inter-power-source noise generated by a logic operation of the cell row in which the fill-cell is formed can be reduced without increasing an area for forming the capacitor. Incidentally, in the present embodiment, the semiconductor substrate below the branch lines BL1 and BL2 is provided with DA1 and DA2 for connecting the element regions of the core cells disposed left and right, but may not be provided with DA1 and DA2 when there is no need to connect the element regions of the core cells.

Seventh Embodiment

In the first embodiment, a description has been made of the case where a capacitor serving as a bypass capacitor has been provided on the core cell. However, in a seventh embodiment, a description will be made of the case where a capacitor is provided above a tap-cell. Incidentally, although the core cell as shown in the first embodiment is mounted on a semiconductor device shown in the seventh embodiment, the description thereof will be omitted.

Figure 14:
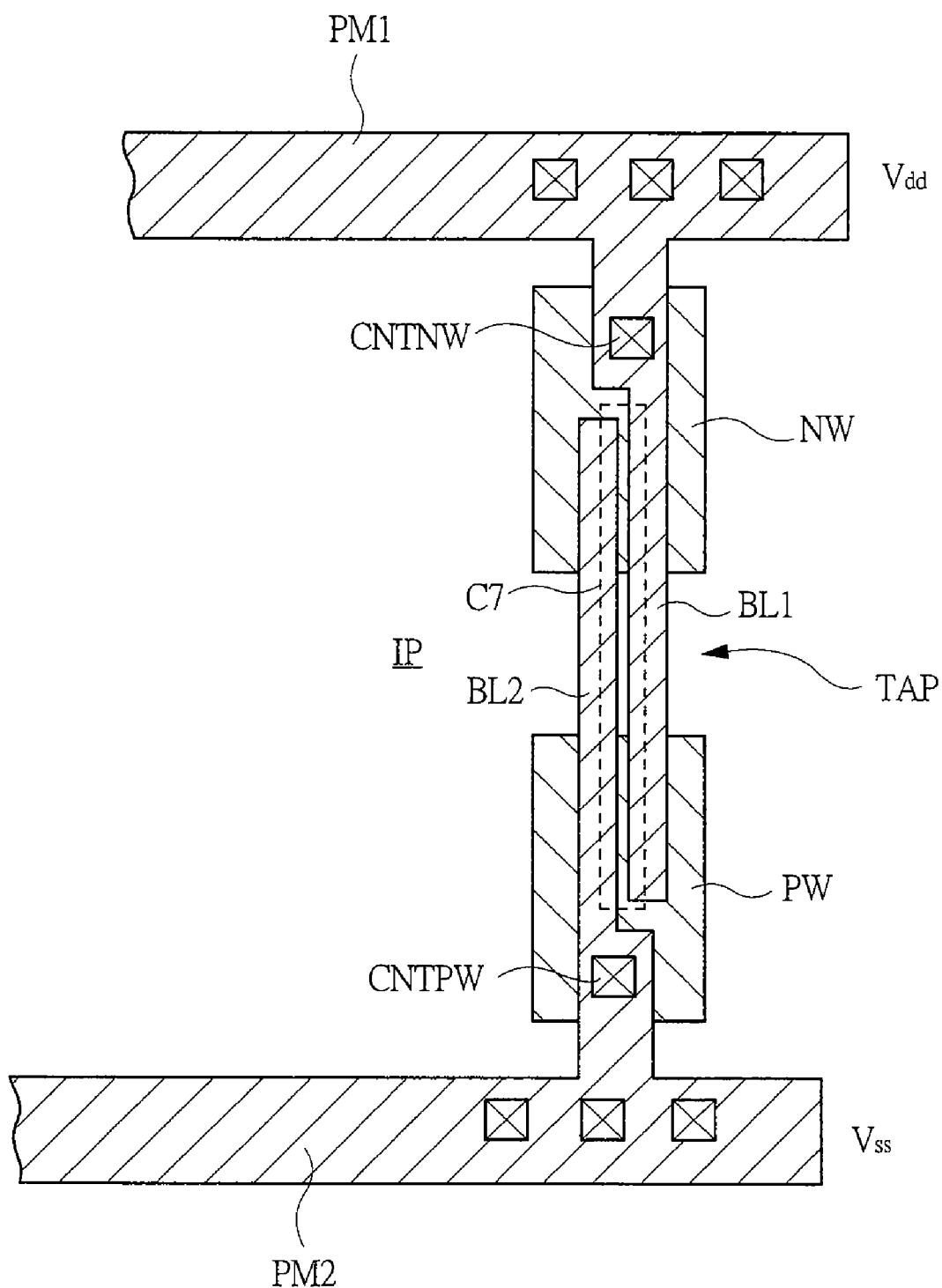
FIG. 14 is a top plan view of a principal part of a semiconductor device according to a seventh embodiment of the present invention.

The tap-cell is mounted on the semiconductor device (for example, LSI) according to the seventh embodiment. The tap-cell is a cell disposed for supplying the power sources Vdd and Vss to a p-type well and an n-type well of a cell row in which the core cells are disposed. FIG. 14 is a top plan view of a principal part of the semiconductor device according to the seventh embodiment. Incidentally, the tap-cell is disposed in the cell row described by referring to FIG. 12 in the sixth embodiment. In FIG. 12, a p-type MIS transistor and an n-type MIS transistor are formed in the region to be provided with the core cell. Also, the power source trunk line PM1 serving as a wiring for the power source Vdd and a power source trunk line PM2 serving as a wiring for the power source Vss in the core cell CL are provided on the semiconductor substrate.

As shown in FIG. 14, in a region to be provided with the tap cell TAP, an n-type well NW and a p-type well PW are insulated and formed by an insulation isolation region IP. The main surface of the semiconductor substrate in the region to be provided with this tap cell TAP is provided with an interlayer insulating film, and the interlayer insulating film is provided with a branch line BL1 electrically connected to the power source trunk line PM1 and a branch line BL2 electrically connected to the power source trunk line PM2. Incidentally, in FIG. 14, the interlayer insulating film is omitted for easily understanding this drawing.

This branch line BL1 and the n-type well NW are electrically connected via a contact CNTNW, and the branch line BL2 and the p-type well PW are electrically connected via a contact CNTPW. As a result, in the region to be provided with the tap-cell TAP, the branch line BL1 electrically connected to the n-type well NW and the branch line BL2 electrically connected to the p-type well PW are oppositely provided, thereby forming a capacitor C7 between the power sources Vbb and Vss.

As shown in FIG. 14, the tap-cell TAP is provided on the main surface of the semiconductor substrate, and the interlayer insulating film is provided on the main surface of the semiconductor device so as to cover the tap-cell TAP.

In this interlayer insulating film, the power source trunk line PM1 for the power source Vdd is provided to the n-type well NW configuring the tap-cell TAP, and the power source trunk line PM2 for the power source Vss is provided to the p-type well PW configuring the tape cell TAP. Also, this interlayer insulating film is provided with the branch line BL1 electrically connected to the power source trunk line PM1 and the branch line BL2 electrically connected to the power source trunk line PM2.

The branch line BL1 is provided so as to extend from the n-type well NW to the p-type well PW, and the branch line BL2 is provided so as to extend from the p-type well PW to the n-type well NW. The branch line BL1 and the n-type well NW are electrically connected via a contact CNT, and the branch line BL2 and the p-type well PW are electrically connected via a contact CNT.

In a region surrounded by dotted lines of FIG. 14, the branch lines BL1 and BL2 are opposed to each other, thereby forming the capacitor C7 between the power sources Vdd and Vss. This capacitor C7 is formed above the tap-cell TAP. In this manner, since the capacitor serving as a bypass capacitor is formed above the tap-cell TAP, the inter-power-source noise can be reduced without increasing the area for forming the capacitor.

Eighth Embodiment

Figure 15:
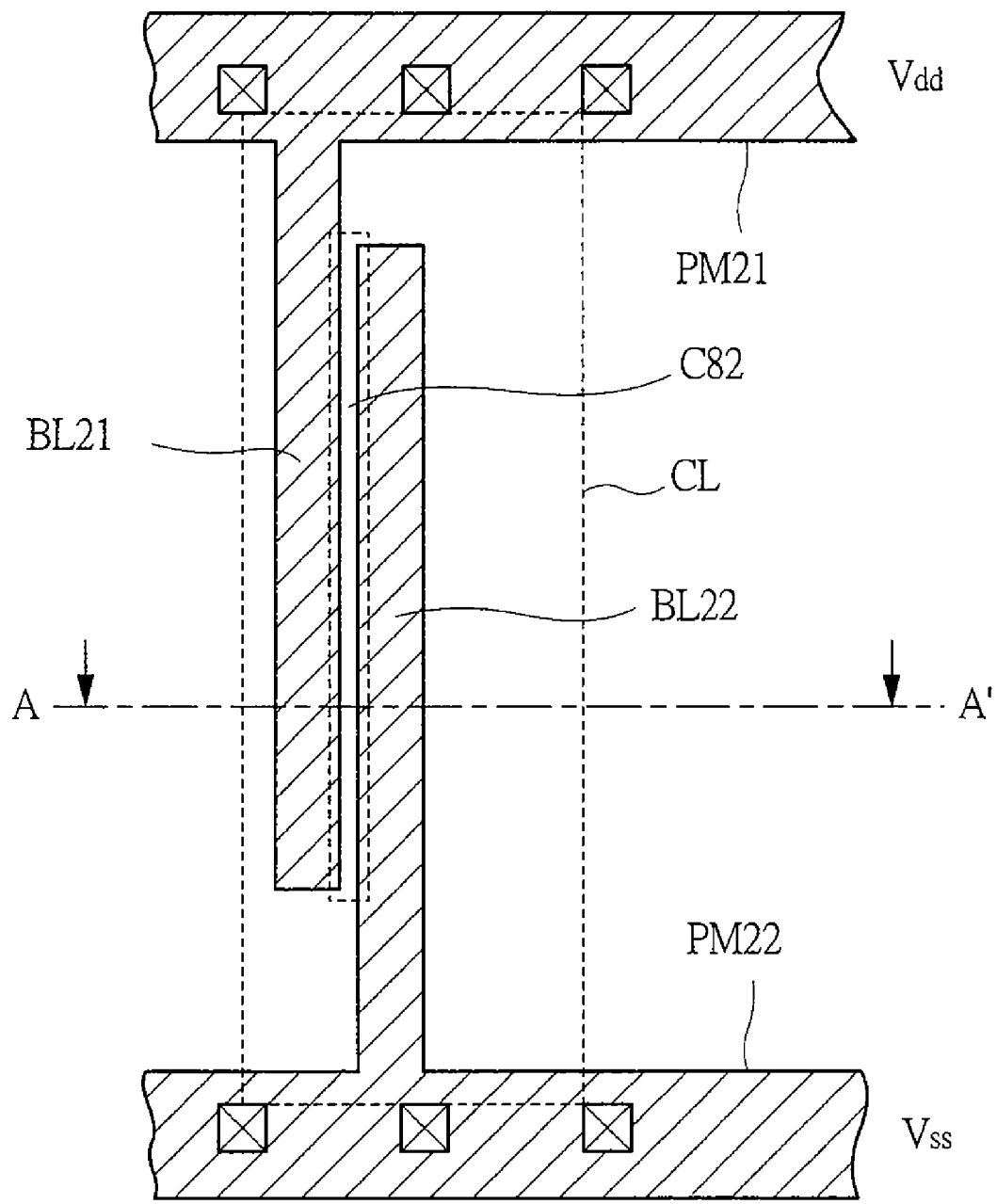
FIG. 15 is a top plan view of a principal part of a semiconductor device according to an eighth embodiment of the present invention.

In the first to seventh embodiments, the examples have shown in which the power source trunk lines PM1 and PM2 use a first-layer metal wiring. In an eight embodiment of the present invention, an example will be shown in which the power source trunk lines use a higher-layer metal wiring than the first-layer metal wiring. Incidentally, since the other configurations are the same as those of the first to seventh embodiments, the description thereof will be omitted. FIG. 15 is a top plan view of a principal part of a semiconductor device according to an eighth embodiment, and FIG. 16 is a cross-sectional view taken along line A-A' of FIG. 15.

Figure 16:
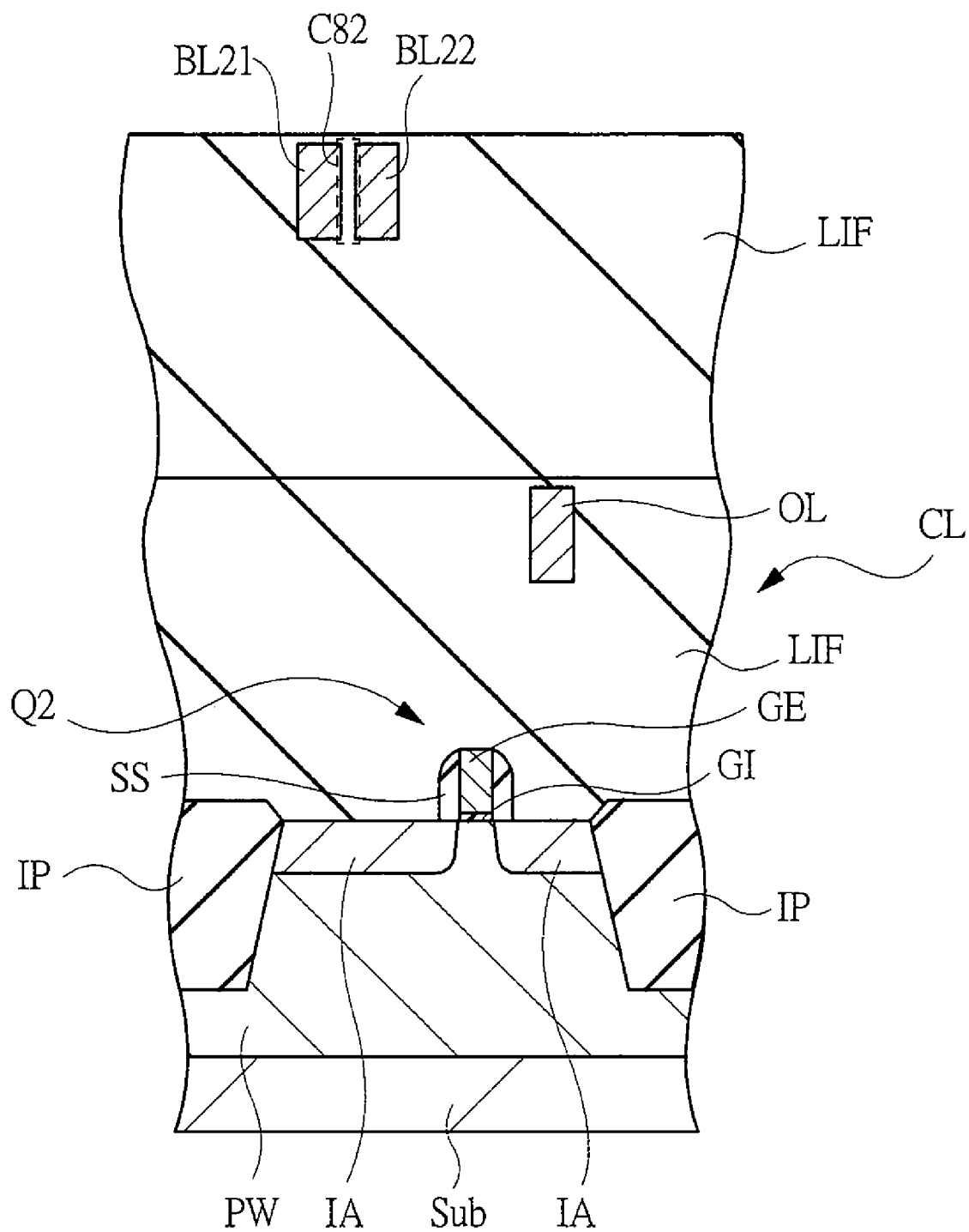
FIG. 16 is a cross-sectional view taken along line A-A' of FIG. 15.

In the eighth embodiment, as shown in FIGS. 15 and 16, when a power source Vdd is supplied by using a power source trunk line PM21 formed by the higher-layer metal wiring provided with a core cell CL and when a power source Vss is supplied by using a power supply trunk line PM22, a branch line BL21 electrically connected to the power source trunk line PM21 and a branch line BL22 electrically connected to the power source trunk line PM 22 are oppositely provided. Incidentally, as the core cell CL has the same configuration as that of the first embodiment, the description thereof will be omitted.

Since the branch lines BL21 and BL 22 are oppositely provided, a capacitor C82 surrounded by dotted lines is formed between the branch line BL21 and the branch line BL22. The capacitor 82 serves as a bypass capacitor between the power sources Vdd and Vss, thereby making it possible to reduce a power source noise by a logic operation of the core cell CL provided in the lower layer.

Figure 17:
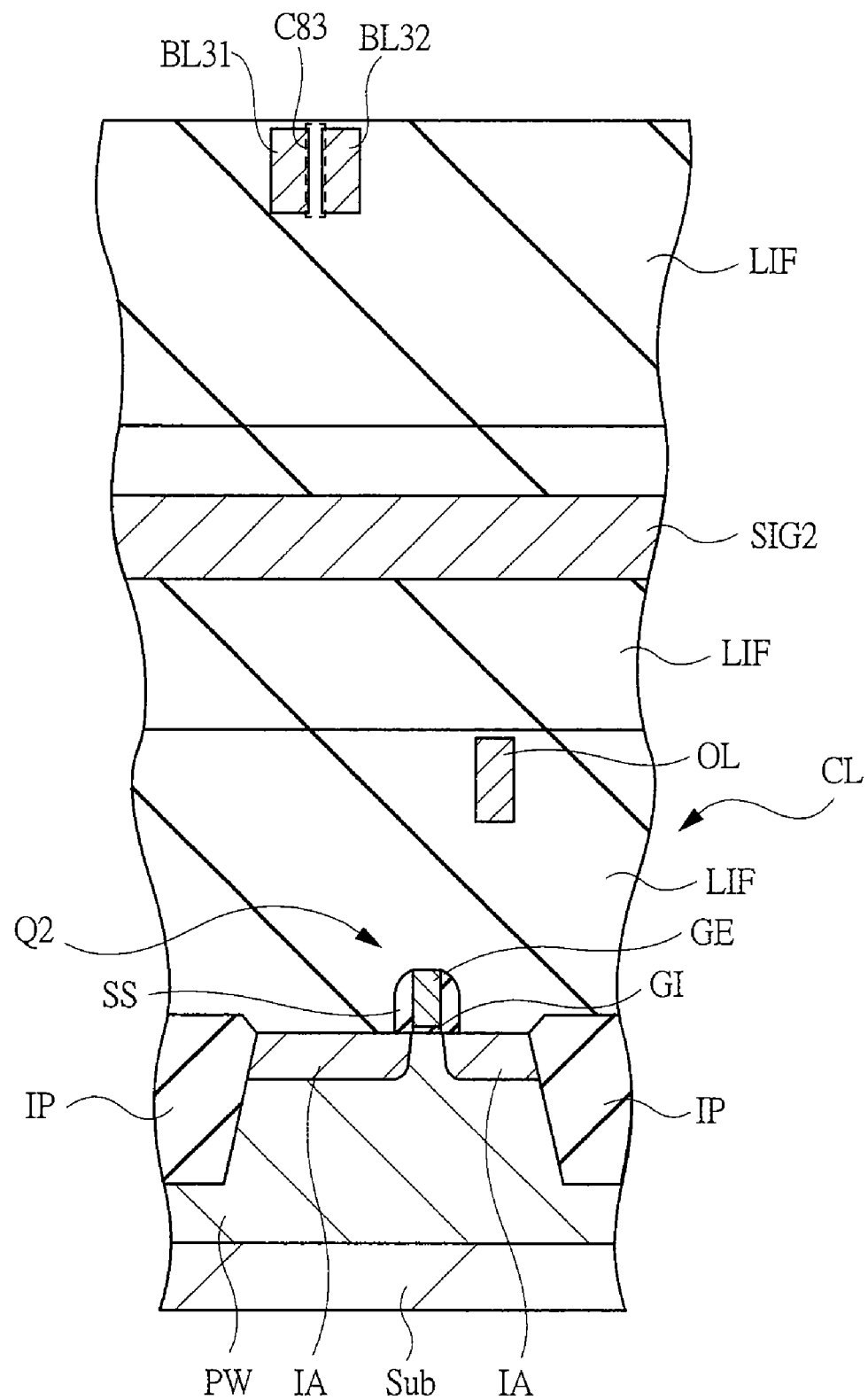
FIG. 17 is a cross-sectional view in which a bypass capacitor is formed by using a third-layer metal wiring.
Figure 18:
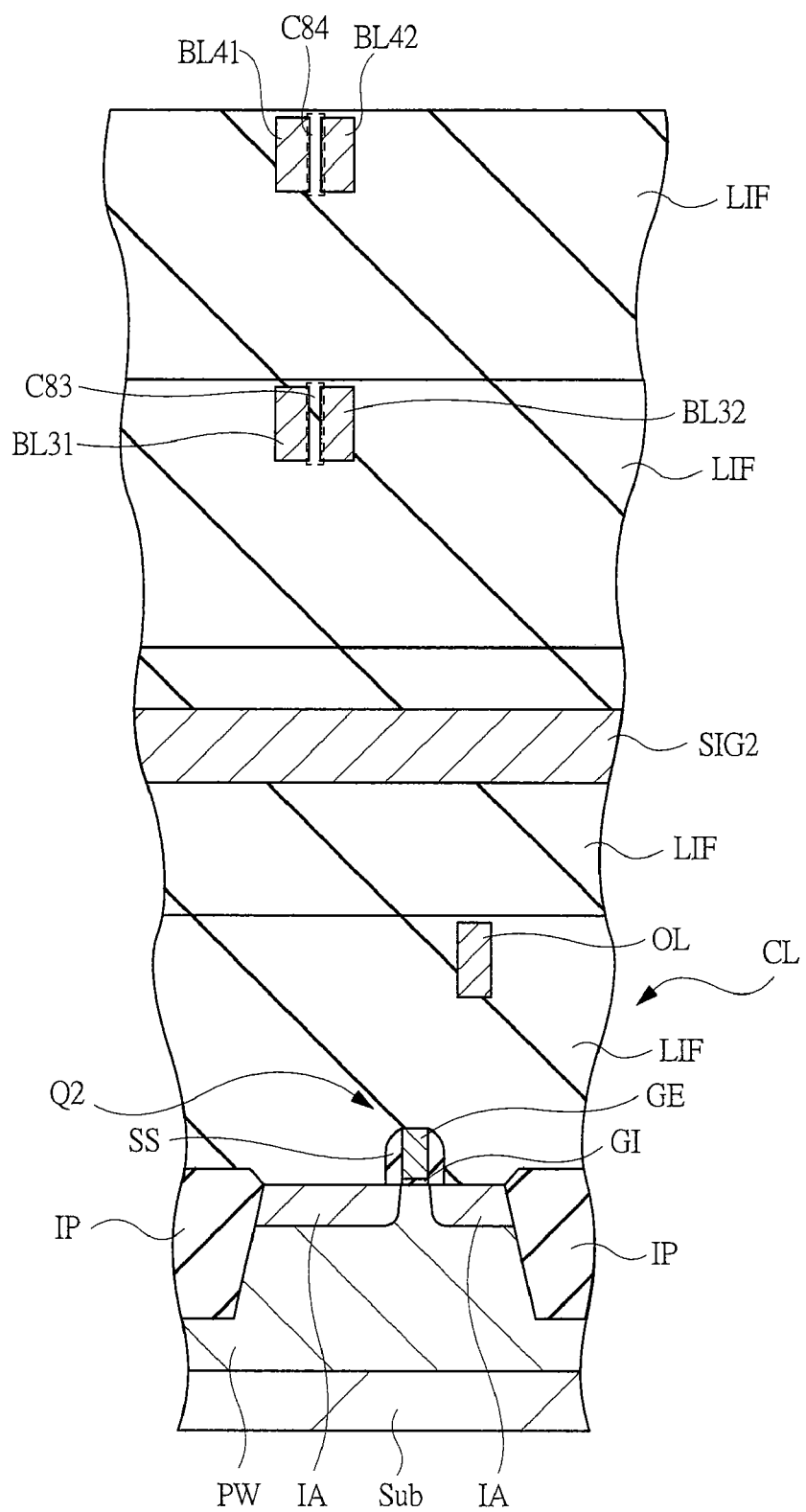
FIG. 18 is a cross-sectional view in which a bypass capacitor is formed by using a fourth-layer metal wiring.

In the eighth embodiment, although an example has been shown in which the second-layer metal wiring (branch line) is used as a higher-layer metal wiring, when a further higher-layer wiring is used as the power source trunk line or when a plurality of wiring layers are used, the same configuration may be formed. FIG. 17 shows a cross-sectional view in which a bypass capacitor is formed by using a third-layer metal wiring, and FIG. 18 shown a cross-sectional view in which the bypass capacitor is formed by using a fourth-layer metal wiring. Reference numerals "BL31" and "BL41" denote branch lines electrically connected to the power source trunk line for the power source Vdd, and the branch line BL31 is provided in a third layer, and the branch line BLA1 in a fourth layer. Reference numerals "BL32" and "BL42" denote branch lines electrically connected to the power source trunk line for the power source Vss, and the branch line BL32 is provided in the third layer, and the branch line BL42 in the fourth layer. Reference numeral "C83" denote a capacitor formed by the branch lines BL31 and BL32 opposed to each other, and is provided in the third layer. Reference numeral "C84" is a capacitor formed by the branch lines BL41 and BL42 opposed to each other, and is provided in the fourth layer. Reference Numeral "SIG2" denotes a signal wiring provided in the second layer.

Thus, in the eighth embodiment, although the cross-sectional views have been shown in which the capacitor is formed by using each of metal layers, a method of forming the bypass capacitor by using the wirings in a plurality of wiring layers may be used at the same time. Moreover, even when the bypass capacitor is formed in the fill-cell shown in the sixth embodiment or when the bypass capacitor is formed in the tap-cell TAP shown in the seventh embodiment, needless to say the same technique as that of the eighth embodiment can be applied.

Ninth Embodiment

In the first to eighth embodiment, a description has been made of the case where the bypass capacitor is formed between the power sources Vdd and Vss. However, in a ninth embodiment of the present invention, a description will be made of the case where a capacitor is formed at an output side wiring OL of the core cell CL.

Figure 19:
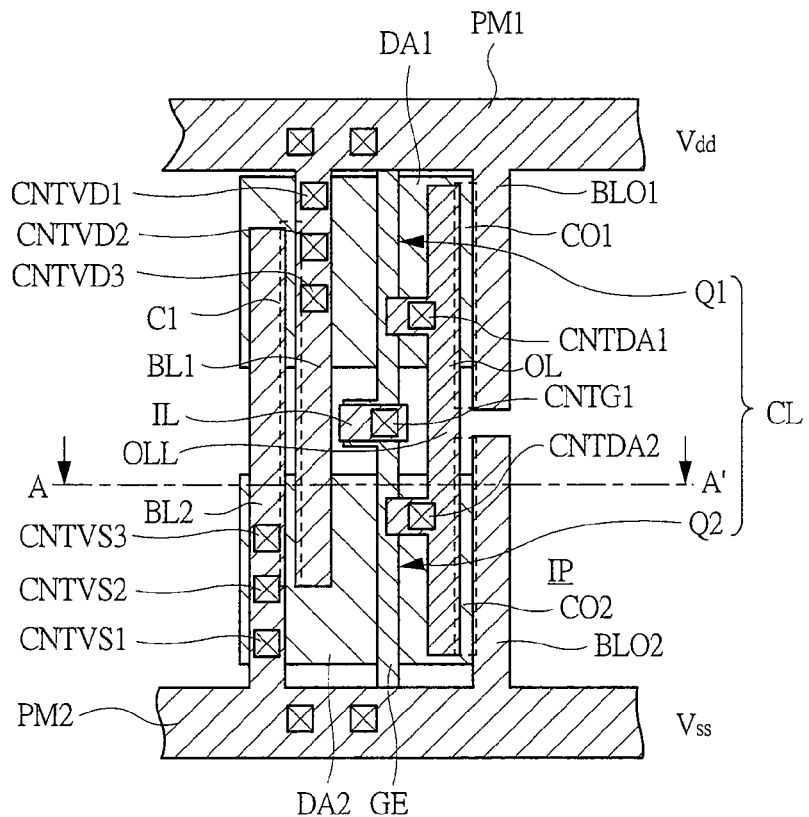
FIG. 19 is a top plan view of a principal part of a semiconductor device according to a ninth embodiment of the present invention.
Figure 20:
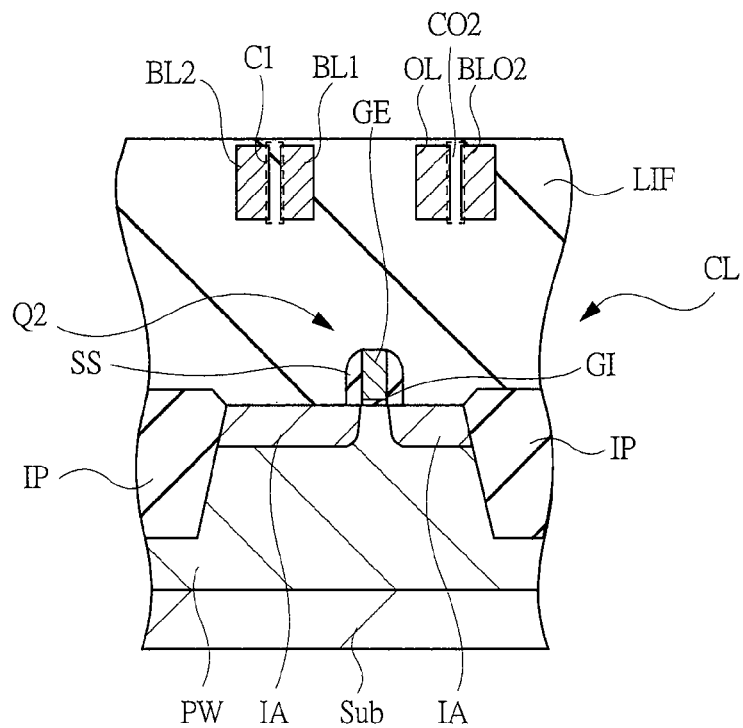
FIG. 20 is a cross-sectional view taken along line A-A' of FIG. 19.
Figure 21:
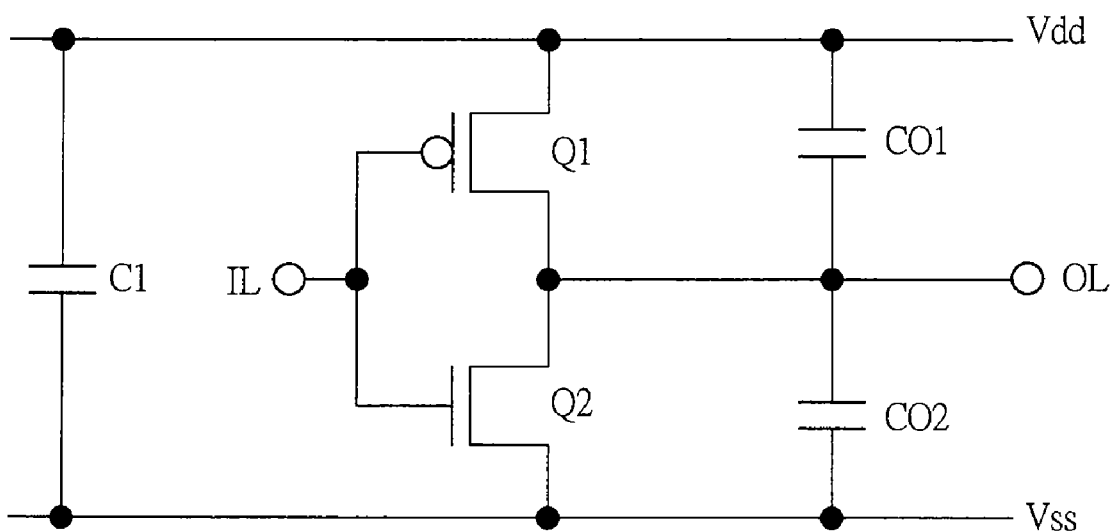
FIG. 21 is an equivalent circuit of the semiconductor device shown in FIG. 19.

FIG. 19 is a top plan view of a principal part of a semiconductor device according to a ninth embodiment, FIG. 20 is a cross-sectional view taken along line A-A' of FIG. 19, and FIG. 21 is an equivalent circuit of the semiconductor device shown in FIG. 19.

As shown in FIG. 19, an output side wiring OL is electrically connected to a contact CNTDA1 via a source of a p-type MIS transistor Q1. The output side wiring OL is also electrically connected to a contact CNTDA2 via a drain of an n-type MIS transistor Q2. That is, the output side wiring OL electrically connects the source of the p-type MIS transistor Q1 and the drain of the n-type MIS transistor Q2.

In the ninth embodiment, a branch line BL01 from a power source trunk line PM1 for the power source Vdd and a branch line BL02 from a power source trunk line PM2 for the power source Vss are oppositely provided with respect to the output side wiring OL of the core cell CL composed of the p-type MIS transistor Q1 and the n-type MIS transistor Q2. As a result, a capacitor CO1 is formed between the output side wiring OL and the power source Vdd, and a capacitor CO2 is formed between the output side wiring OL and the power source Vss. Since the capacitor CO1 and the capacitor CO2 are connected to the output side wiring OL in this manner, a change of the output is made at a slower pace, so that the core cell CL can be used as a delay element.

In the ninth embodiment, an example has been shown in which the branch lines BL01 and BL02 are oppositely provided with respect to the output side wiring OL and the capacitor CO1 is formed between the output side wiring OL and the power source Vdd and the capacitor CO2 is formed between the output side wiring OL and the power source Vss, but either one of the branch lines may be provided.

Further, in the ninth embodiment, the branch lines BL01 and BL02 extending from the power source trunk lines PM1 and PM2 are each provided at the maximum length to be allowed in a design rule and are formed so that each value of the capacitors formed between the output side wiring OL and the power sources Vdd and Vss becomes large. However, since the lines are not necessarily made the maximum in length, their opposed length is adjusted if needed so that the delay time can be adjusted.

Further, in the ninth embodiment, although an example has been recited in which the power source trunk lines PM1 and PM2 shown in the first embodiment are provided respectively with the branch lines BL1 and BL2 to form the capacitor C1 (bypass capacitor), the capacitor C1 may be not formed if needed.

Tenth Embodiment

A tenth embodiment of the present invention is an example in which the core cell, the fill-cell, and the tap-cell shown in the first to ninth embodiments are applied to design of the semiconductor device. In the tenth embodiment, a circuit description, which includes connection information of the transistor and gate and size information of the transistor, and a self-library, which includes information of the core cell, fill-cell, tap-cell, and the like, are read into a disposing/wiring means, thereby generating layout information including graphical information of layout, position information of terminals, and the like.

Figure 22:
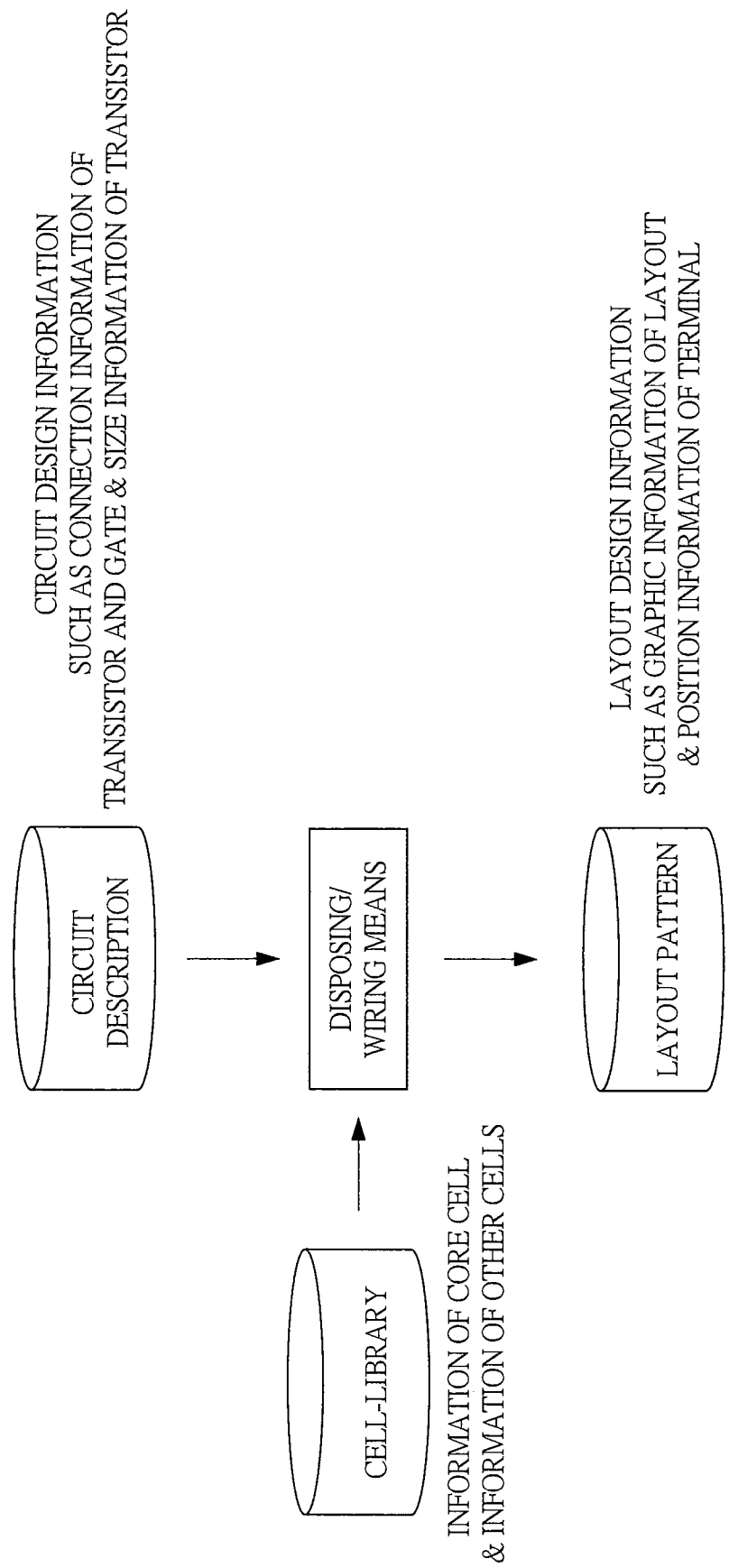
FIG. 22 is a view representing a processing flow of design of a semiconductor device according to a tenth embodiment of the present invention.

FIG. 22 is a view showing a processing flow of the tenth embodiment. The circuit description is a storage medium for storing descriptions including the connection information of the transistor and gate, the size information of the transistor, and the like. The cell library is a storage medium for storing libraries including the information of the core-cell, fill-cell, and tap-cell. The disposing/wiring means generates a layout pattern from the circuit description and the cell-library according to a fixed algorism. The disposing/wiring means is realized by a program designed to execute a disposing/wiring processing in cooperation with a computer device. Usually, the disposing/wiring means is the same as that used as a design tool. The layout pattern generated from the disposing/wiring means is recorded in the storage medium in the form including the graphical information of the layout, the positional information of the terminals, and the like.

In the tenth embodiment, the information of the core cells, fill-cells, and tap-cells described in the first to ninth embodiments is kept stored in the cell-library, so that by performing the disposing/wiring processing, the core-cell, fill-cell, and tap-cell containing the bypass capacitor as well as the delay capacitor of the output can be reflected on the layout pattern of the semiconductor device.

As described above, the invention made by the present inventors has been specifically described based on the embodiments, but the present invention is not limited to the above-described embodiments and, needless to say, can be variously modified within a scope of not departing from the gist thereof.

For example, in the first embodiment, although a description has been made of the case where the inverter is applied to the logic core cell, the inverter may be applied to AND, NAND, and NOR circuits and the like.

The present invention is widely used in the semiconductor devices, particularly the semiconductor devices each having a logic circuit composed of a plurality of core cells.

What is claimed is:
1. A semiconductor device comprising:
a core cell configuring a logic circuit provided over a main surface of a semiconductor substrate;
an interlayer insulating film provided over the main surface of the semiconductor substrate so as to cover the core cell;
a first power source trunk line for a first power source of the core cell, the first power source trunk line being provided in the interlayer insulating film;
a second power source trunk line for a second power source of the core cell, which is different from the first power source, the second power source trunk line being provided in the interlayer insulating film;
a first branch line provided in the interlayer insulating film and electrically connected to the first power source trunk line; and a second branch line provided in the interlayer insulating film and electrically connected to the second power source trunk line, wherein the first and second branch lines are oppositely provided, thereby forming a capacitor between the first and second power sources, wherein first and second element regions to form elements configuring the core cell are adjacently provided over the main surface of the semiconductor substrate, the first branch line is provided so as to extend from the first element region to the second element region, the second branch line is provided so as to extend from the second element region to the first element region, and at least one of the first and second branch lines is provided beyond a boundary between the first and second element regions.

2. The semiconductor device according to claim 1, wherein the capacitor is provided above the core cell.

3. The semiconductor device according to claim 1, wherein the first and second branch lines are provided in the same layer.

4. The semiconductor device according to claim 1, wherein the core cell forms an inverter.

5. The semiconductor device according to claim 1, wherein, in size of each cross section of the first and second branch lines, a dimension in a direction parallel to the main surface of the semiconductor substrate is shorter than a dimension in a direction vertical to the main surface of the semiconductor substrate.

6. The semiconductor device according to claim 1, wherein a tip portion of the first branch line and a tip portion of the second branch line are opposed to each other, thereby forming the capacitor.

7. The semiconductor device according to claim 1, wherein the core cell forms a flip-flop.

* * * * *